(12) United States Patent
Kozodoy et al.

(10) Patent No.: US 10,345,563 B2
(45) Date of Patent: Jul. 9, 2019

(54) SUNLIGHT COLLECTION SYSTEM WITH ASYMMETRIC CATADIOPTRIC OPTICS

(71) Applicant: Glint Photonics, Inc., Burlingame, CA (US)

(72) Inventors: Peter Kozodoy, Palo Alto, CA (US); Christopher Gladden, San Mateo, CA (US); Michael Pavilonis, San Francisco, CA (US); Christopher Rhodes, Oakland, CA (US); Victor Chub, Burlingame, CA (US)

(73) Assignee: Glint Photonics, Inc., Burlingame, CA (US)

( * ) Notice: Subject to any disclaimer, the term of this patent is extended or adjusted under 35 U.S.C. 154(b) by 0 days.

(21) Appl. No.: 15/884,104

(22) Filed: Jan. 30, 2018

(65) Prior Publication Data
US 2018/0164561 A1  Jun. 14, 2018

Related U.S. Application Data

(63) Continuation-in-part of application No. 15/333,970, filed on Oct. 25, 2016.
(Continued)

(51) Int. Cl.
*F24S 23/30* (2018.01)
*G02B 19/00* (2006.01)
(Continued)

(52) U.S. Cl.
CPC ........ *G02B 19/0042* (2013.01); *F21S 11/002* (2013.01); *F24S 10/00* (2018.05);
(Continued)

(58) Field of Classification Search
CPC .................. F24S 23/30; F24S 10/00
See application file for complete search history.

(56) References Cited

U.S. PATENT DOCUMENTS

| 4,411,490 A * | 10/1983 | Daniel ................. F21S 11/00 126/648 |
| 9,274,266 B2 | 3/2016 | Ford et al. |

(Continued)

OTHER PUBLICATIONS

EPO as ISA for PCT/US2016/058950, "International Search Report and Written Opinion," dated Dec. 15, 2016, 13 pages.
(Continued)

*Primary Examiner* — Chris H Chu
(74) *Attorney, Agent, or Firm* — Patent Law Group LLP; Brian D. Ogonowsky

(57) ABSTRACT

The system captures and concentrates sunlight for transmission to interior spaces or to a PV system. A solar collector uses arrayed refractive lenses, opposing concave focusing mirrors, and a movable coupling sheet forming part of a lightguide. The lenses and mirrors have an asymmetric shape, such as having aspect ratios of 3:4 or 1:2, so as to have an asymmetric aperture to better receive light at the different ranges of angles of the sun's rays over the course of a year. The long axis of the apertures is generally oriented in an East-West. The movable sheet contains small angled mirrors, and the sheet is translated to position the angled mirrors at the focal points of the sunlight for maximum deflection of the sunlight to an output of the collection system. A position sensor provides feedback regarding the position of the angled mirrors relative to the focal points.

16 Claims, 22 Drawing Sheets

Related U.S. Application Data

(60) Provisional application No. 62/452,380, filed on Jan. 31, 2017.

(51) Int. Cl.
| | |
|---|---|
| *H01L 31/054* | (2014.01) |
| *F21S 11/00* | (2006.01) |
| *F21V 8/00* | (2006.01) |
| *G02B 17/08* | (2006.01) |
| *F24S 10/00* | (2018.01) |
| *F24S 30/20* | (2018.01) |
| *F24S 23/00* | (2018.01) |

(52) U.S. Cl.
CPC ............... *F24S 23/30* (2018.05); *F24S 30/20* (2018.05); *G02B 6/003* (2013.01); *G02B 6/0031* (2013.01); *G02B 6/0036* (2013.01); *G02B 17/0868* (2013.01); *G02B 19/0028* (2013.01); *H01L 31/0543* (2014.12); *H01L 31/0547* (2014.12); *F24S 23/12* (2018.05); *Y02E 10/44* (2013.01); *Y02E 10/52* (2013.01)

(56) References Cited

U.S. PATENT DOCUMENTS

| | | |
|---|---|---|
| 2011/0226332 A1 | 9/2011 | Ford et al. |
| 2012/0056081 A1 | 3/2012 | Kozodoy |
| 2013/0160820 A1 | 6/2013 | Lin et al. |
| 2014/0261621 A1 | 9/2014 | Gruhlke et al. |
| 2017/0250649 A1* | 8/2017 | Liu ..................... H02S 20/32 |

OTHER PUBLICATIONS

EPO as ISA for PCT/US2018/016271, "International Search Report and Written Opinion", dated Apr. 20, 2018, 15 pages.

Mellette et al., "Planar waveguide LED illuminator with controlled directionality and divergence", Optics Express, Apr. 1, 2014, pp. A742-A758, vol. 22, No. S3.

Price et al., "Wide-angle planar microtracking for quasi-static microcell concentrating photovoltaics", Nature Communications, Feb. 5, 2015, pp. 1-8, Macmillan Publishers Limited.

* cited by examiner

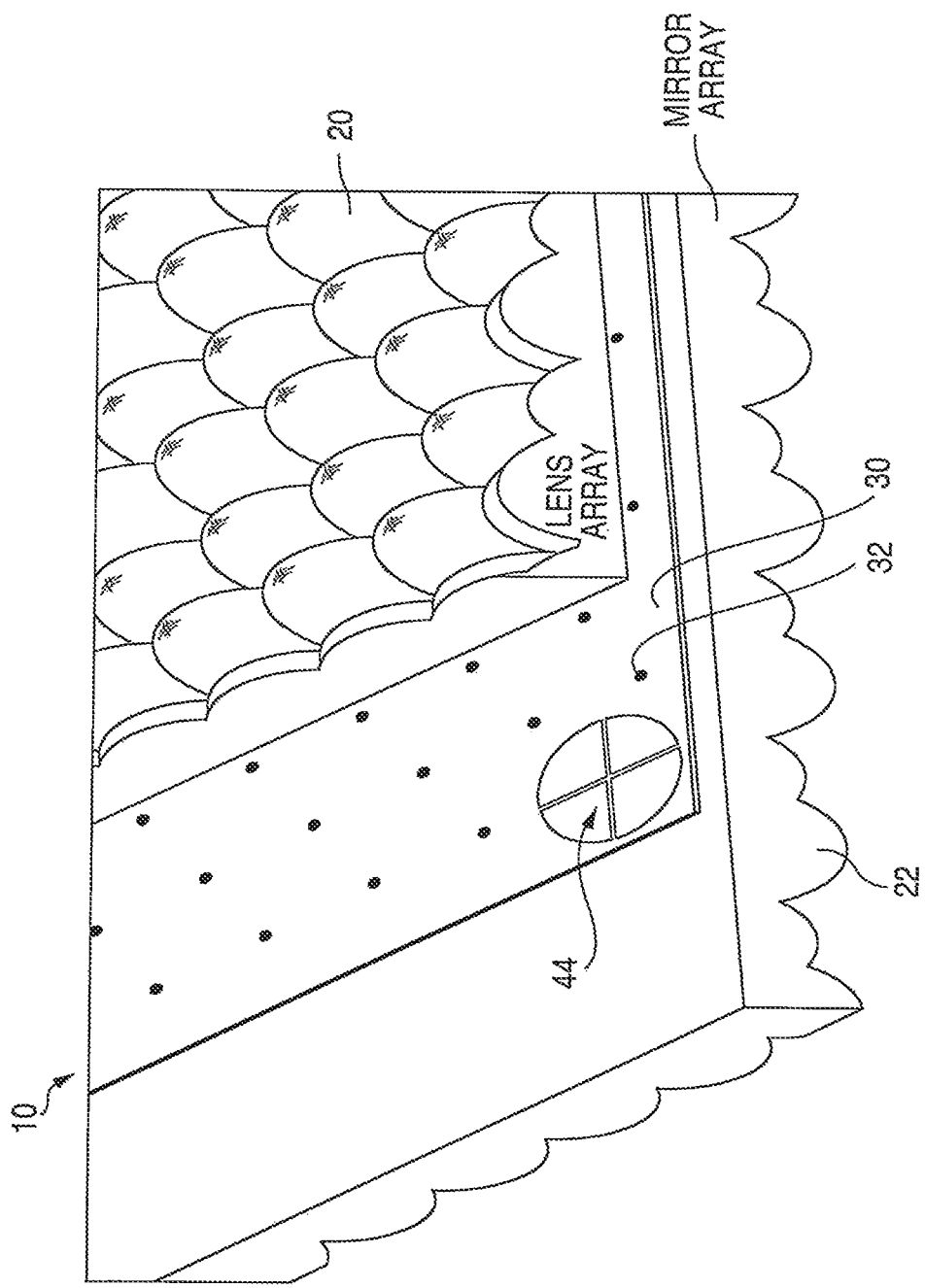

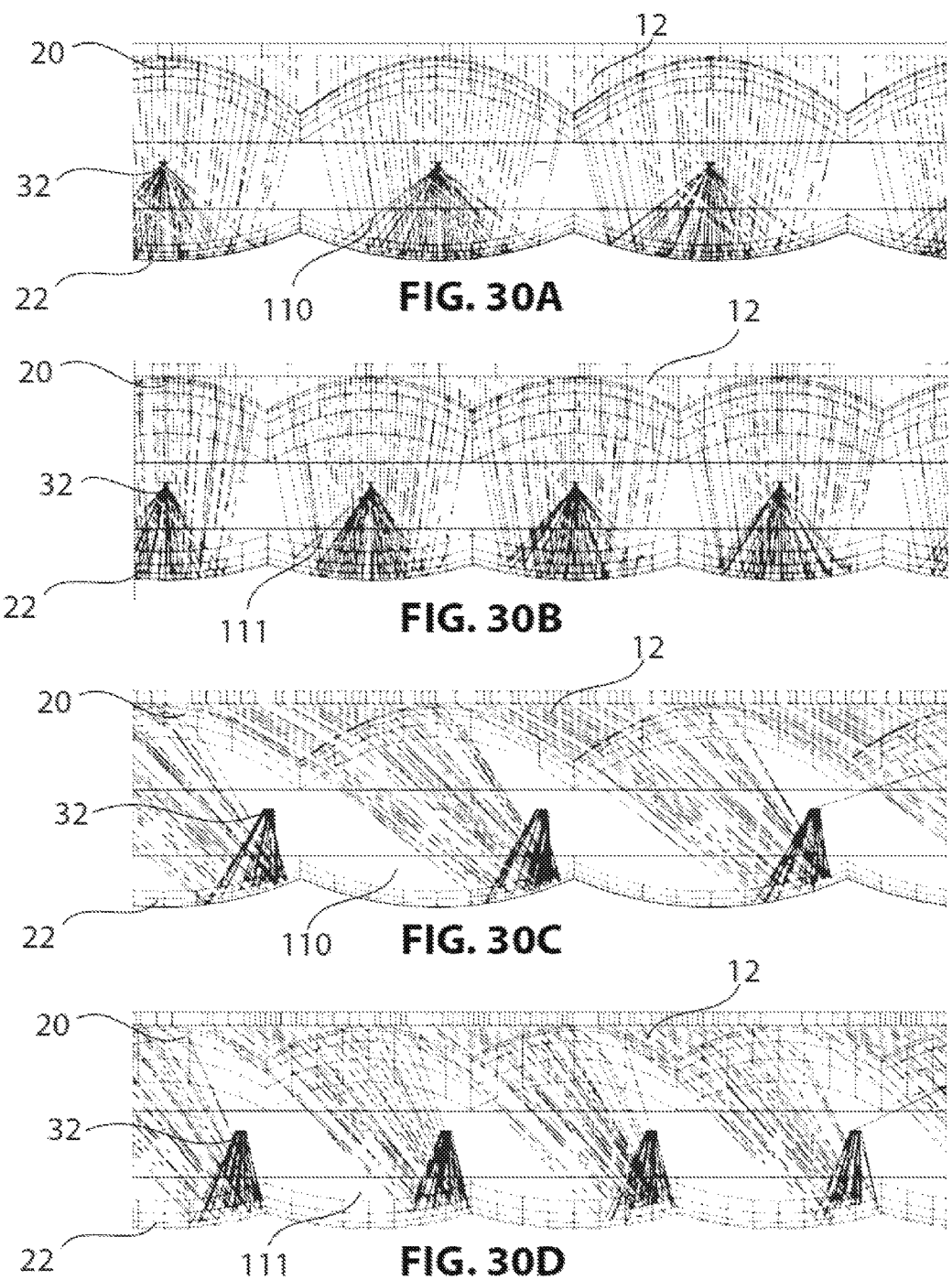

SUNLIGHT COLLECTION SYSTEM WITH ASYMMETRIC CATADIOPTRIC OPTICS

CROSS-REFERENCE TO RELATED APPLICATIONS

This application claims priority to U.S. provisional application Ser. No. 62/452,380, filed Jan. 31, 2017, by Christopher Gladden et al., and is a continuation-in-part of U.S. application Ser. No. 15/333,970, filed Oct. 25, 2016, by Peter Kozodoy et al., both incorporated herein by reference.

GOVERNMENT LICENSE RIGHTS

This invention was made with Government support under contract DE-AR0000332 awarded by the Advanced Research Projects Agency-Energy (ARPA-E), a division of the Department of Energy. The Government has certain rights in the invention.

FIELD OF THE INVENTION

The present invention relates to optical systems for capturing and concentrating sunlight so that it may be used for interior illumination or for directing light into a photovoltaic system.

BACKGROUND

U.S. Pat. No. 9,274,266 describes a solar concentrator that contains an array of focusing lenses and a corresponding array of convex focusing mirrors. The lenses have symmetric apertures. The combination of refractive lenses and reflectors is known as catadioptric pairs. Between the lenses and mirrors at the focal plane is a movable transparent lightguide having an array of angled reflector elements, where there is one angled reflective element per pair of lenses and focusing mirrors. When the focal spots of the lenses/mirrors fall upon the reflector elements, the light is optimally deflected into the lightguide and is trapped by total internal reflection (TIR) until the light exits an edge of the light guide. Photovoltaic (PV) cells are attached along the edge of the lightguide. The lightguide is translated laterally so that the reflector elements remain aligned with the focal spots as the angle of incident sunlight changes over time so there is a maximum of light that is emitted by the edge of the lightguide.

A related prior art solar concentrator (described in Nature Communications, DOI:10.1038/ncomms7223, Entitled Wide-Angle Planar Microtracking for Quasi-Static Microcell Concentrating Photovoltaics, 2015, by Price et al.) contains an array of top focusing lenses and bottom focusing mirrors, forming catadioptric pairs. The array of catadioptric pairs provides an array of focal spots, and the catadioptric pairs are optimized so that the focal spots remain substantially in a single plane as the angle of incident sunlight varies over a wide range. A corresponding array of photovoltaic cells on a moveable sheet translates at the focal plane of the catadioptric pairs by microtracking so that the focal spots of the catadioptric pairs remain aligned with the photovoltaic cells as the angle of incident sunlight changes over time.

A drawback of the two systems described above is that they require movement of the entire lightguide (including the PV cells at the lightguide output) or PV sheet relative to the catadioptric pairs. This requires external moving parts, subject to degradation in the environment. A further limitation of both prior art systems is that the designs are solely intended for electricity generation and do not contemplate the harvest of concentrated light for interior illumination.

What is needed is a sunlight collection and concentration system that is highly robust, requires minimal control systems, is very flexible in its implementation, and provides high-quality sunlight for interior illumination.

SUMMARY

In one embodiment, the system captures and concentrates sunlight for transmission to interior spaces as an illumination source. A solar collector using arrayed catadioptric focusing optics and a movable coupling sheet within a lightguide is combined with an edge-mounted fiber optic bundle, or other optical transmitter, to deliver sunlight into interior spaces.

The lightguide includes a transparent solid sheet containing small angled mirrors, where each mirror corresponds to a particular pair of a refractive focusing lens and a focusing mirror, in a catadioptric array. The lightguide also includes a fluid, such as a transparent oil, surrounding the transparent sheet. The fluid is substantially stationary and is contained in a sealed transparent cavity. The overall lightguide (including the movable sheet and fluid) may be kept stationary and consistently guide light to the stationary exit wall, despite internal motions of the movable sheet which cause the position of the angled mirrors within the lightguide to be varied. The sheet is suspended in the fluid and is easily translated by a magnetic system, a piezo electric system, or other suitable system.

The arrayed catadioptric focusing optics may have an asymmetric aperture generally corresponding to the asymmetric angular range of the sun over the year. Each refractive lens in the light-receiving lens array, and its associated mirror in the catadioptric array, has a rectangular or other elongated footprint, so each lens and mirror has a long axis and a short axis. During use as a stationary collector, where only the sheet with the angled reflectors moves, the long axis of the optics is substantially aligned East-West and the short axis of the optics is substantially aligned North-South. The lenses in the array provide a cone of sunlight that can be consistently focused on the angular reflectors over the course of a day and over the course of a year, as the sun's arc changes (higher arcs in summer and lower arcs in winter). The asymmetric nature of the lenses results in a cone of sunlight on the angled reflectors that is narrower in one dimension than the other, which enables the light to be more efficiently coupled into the lightguide.

Various X-Y actuators for the movable sheet are described. The actuators may be used for other than solar collection, where X-Y positioning is needed.

A further understanding of the nature and advantages of the present invention may be realized by reference to the remaining portions of the specification and the drawings.

BRIEF DESCRIPTION OF THE DRAWINGS

FIG. 7 is a cut-away perspective view of the focusing lens array, the floating transparent sheet (part of the lightguide), and the mirror array. A photosensor (active or passive) is shown in the sheet for providing feedback to optimally position the sheet.

FIGS. 30A-3D are ray trace diagrams of an asymmetric catadioptric lens system, along its long axis and short axis, showing how sunlight at two different angles is focused on angled mirrors.

Elements that are the same or equivalent in the various figures are labeled with the same numeral.

DETAILED DESCRIPTION

Figure 1:
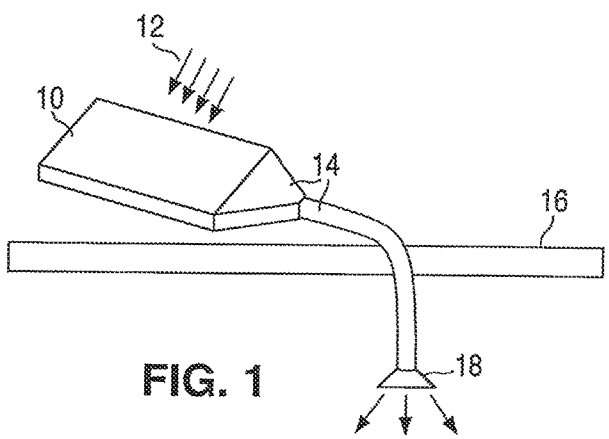
FIG. 1 is schematic of a daylighting system in accordance with one embodiment of the invention.

FIG. 1 illustrates a solar concentrator panel 10 receiving direct sunlight 12 and directing the impinging sunlight to an extraction edge of the panel 10, where the concentrated light is then directed by transmission optics 14 to illuminate the inside of a building 16. A luminaire 18 may be used to create a desired light emission profile inside the building.

Figure 2:
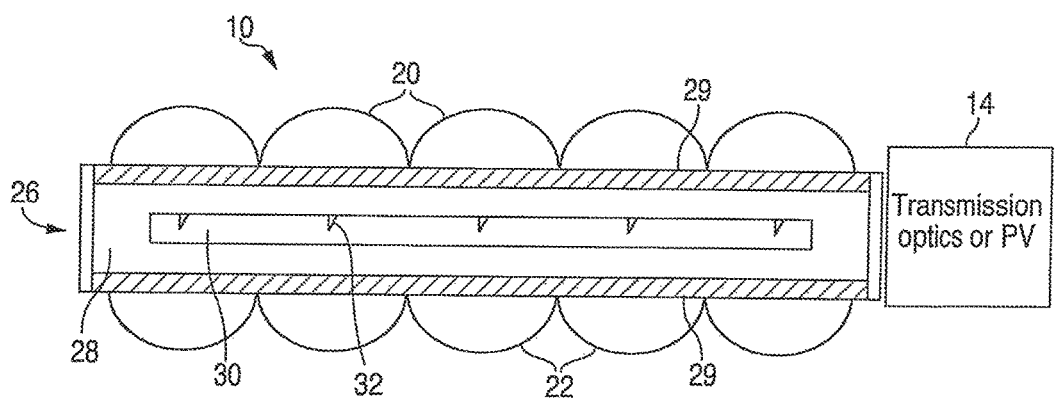
FIG. 2 is a cross-sectional view of focusing optics and a lightguide, where the lightguide comprises a solid transparent movable sheet and a transparent fluid surrounding the sheet, where the fluid and sheet are contained in a transparent sealed cavity.

FIG. 2 shows a cross-section of one embodiment of the collection optics.

The collection optics comprises an array of catadioptric focusing elements (catadioptric pairs), each catadioptric focusing element comprising a front refractive focusing lens 20 and a back reflecting, concave focusing mirror 22. The shape of these two optical elements in the catadioptric pair is optimized so that collimated incident light produces a well-focused spot on a single focal plane over a wide range of incident angles, for example within a cone of half-angle measuring 40° or more, and most preferably at least 60°, from the normal to the lens surface. The top lens array may be molded plastic. The reflective focusing mirror array may be a molded plastic sheet with a thin reflective film or a stamped reflective metal sheet.

A single panel 10 may be on the order of 3 square feet. Each lens 20 and mirror 22 may have a diameter of about 2 cm, and the thickness of the panel 10 may be about 1-3 cm.

Between the refractive lenses and the reflective focusing mirrors is a lightguide 26 that comprises a transparent fluid 28 contained between two or more transparent cladding layers 29, forming the upper and lower walls of a sealed cavity. The top and bottom cladding layers 29 adjacent the fluid 28 have a low index of refraction so there is total internal reflection (TIR) within the lightguide 26. The cladding layers 29 may be a transparent solid such as a fluorinated polymer, or may instead be a low index non-solid gel or gas abutting a surface of the sealed transparent cavity. The lightguide 26 also comprises a movable solid transparent sheet 30 that is suspended within the fluid 28 at the focal plane of the catadioptric focusing elements. The fluid 28 layer may be very thin. The sheet 30 thickness may be less than 0.5 cm.

Figure 3:
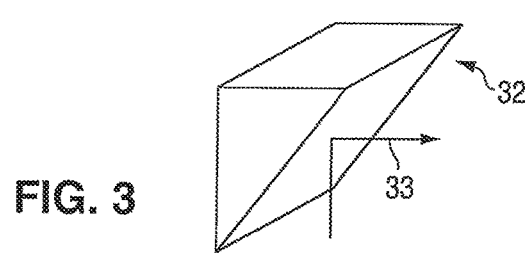
FIG. 3 is a perspective view one of the angled mirrors in the movable sheet that are optimally positioned at the focal points of the sunlight so the maximum amount of sunlight is directed to an edge of the lightguide and out of the sealed cavity.

The movable sheet 30 contains an array of small tilted mirrors 32 matching the periodicity of the lens/mirror arrays. FIG. 3 is a perspective view of one of the mirrors 32 and a light ray 33 being reflected off the tilted face. Prisms may be used instead of mirrors, where the prisms reflect by TIR. When the sheet 30 is moved within the xy plane so that the tilted mirrors 32 are at the focal spots, the light at the focal spots is deflected sideways (to the right) by the mirrors 32 so that all or most of it is captured in guided modes of the lightguide 26 by TIR. The right edge of the lightguide 26, which may be the external face of the sealed cavity, is a light extraction surface and may include light extraction features, such as a roughened surface to reduce TIR off the edge. The stationary extraction surface is optically coupled to light transmission optics 14 or a PV system.

The movable sheet 30 is translated within the fluid 28 so that the mirrors 32 follow the locations of the focal spots as the angle of incident sun light varies over time. Each mirror surface has an area about 0.5% that of its associated refractive lens 20. The movable sheet 30 may be caused to move within the fluid 28 to track the sun by any of a variety of mechanisms, described later.

The tilted mirrors 32 in the sheet 30 may have a single tilted side (which may be at) 45° so that all light is directed to one extraction edge of the rectangular lightguide 26, or the mirrors may have two or more tilted sides that divide the impinging light and direct the light to two or more edges of the lightguide 26. The mirrors 32 may be formed by molding the transparent sheet 30 to have the indented wedges of FIG. 3, then a reflective material, such as silver, is deposited in the indented wedges, such as using screen printing or deposition using a mask, to form a reflective film. In another embodiment, the tilted surface of the mirrors 32 is not flat but may be curved.

All layers are chosen to have a high transmission of visible wavelength light. The cladding layers 29 have a refractive index that is lower than the refractive index of the lightguide layers so that light is captured within the lightguide 26 (the fluid 28 and the sheet 30) by TIR. Separate cladding layers 29 may not be needed if the lens 20 and mirror 22 layers have a sufficiently low refractive index. The transparent cavity may be substantially surrounded by an air gap to provide an additional TIR interface in the event light enters the cladding layers 29.

The lenses 20 and movable sheet 30 may be made of glass or a transparent polymer such as PMMA or polycarbonate or other transparent polymers. The cladding layers 29 may be made of a fluoropolymer, an aerogel, a gas such as air, or any other low-refractive-index material.

In one embodiment, the lens array 40 has an index of 1.5, and the cladding layers 29 have a lower index of 1.3. The fluid 28 and sheet 30 may have the same index as the sheet 30, or have an index higher than that of the sheet 30 (which would still be higher than the index of the cladding layers 29), or the fluid 28 may have a lower index than the sheet 30 so the light is confined to the sheet 30 by TIR. The cladding layers 29 preferably have a refractive index between 1 and 1.35, and the lightguide 26 materials preferably have a refractive index between 1.45 and 1.6.

The fluid 28 within the lightguide 26, in one embodiment, has a refractive index close to or equal that of the solid sheet 30. It may be composed of an oil, such as hydrocarbon or silicone oil or a mixture thereof. It may contain oils that are modified by the addition of phenyl groups or halogens to increase refractive index. It may also be composed of a polar fluid such as an aqueous solution, or a glycol or glycerin containing fluid or a mixture thereof. Thiodiglycol is an example polar fluid of high refractive index that may be used in the lightguide 26. The fluid 28 may have a density substantially equal to that of the solid sheet 30, so the sheet 30 is essentially suspended in the fluid 28. Alternatively, the sheet 30 is suspended in the fluid 28 by magnetic coupling. Although the fluid 28 may have some slight coloration, it is still considered transparent for purposes of this disclosure, since the coloration does not substantially reduce the amount of light passing through the thin layer of fluid 28.

In another embodiment, the fluid 28 has an index lower than that of the sheet 30, so that light is guided only within the sheet 30 by TIR. In such a case, the fluid 28 acts as cladding layers for the sheet 30. The lightguide 26 will then only be the movable sheet 30. The light exiting the edge of the sheet 30 then passes through the fluid 28 and through a transparent wall of the sealed cavity. Separate cladding layers 29 are not needed in this case. The transparent cavity may be substantially surrounded by an air gap to provide an additional TIR interface to reflect back any light entering the fluid 28.

Although non-gas fluids are preferred for the fluid 28 for ease of use, the fluid 28 may be a gas, such as air, and the sheet 30 may be suspended in the gas by a suitable low-friction support structure or a magnetic support.

The guided light impinges on the light exit window of the lightguide 26 (the right edge shown in FIG. 2) at an angle close to normal so light is extracted from the guide efficiently. Other edges of the lightguide 26 may have a reflective layer to prevent light escaping through other than the intended light extraction edge.

The concentrator panel 10 may be mounted on a moving structure that follows the sun in order to maximize sunlight collection. Alternatively, the panel 10 may be mounted in a fixed stationary configuration. It is a special characteristic of this invention that it allows high-efficiency sunlight collection and concentration over a wide range of incident angles, permitting use in a stationary configuration.

Figure 4:
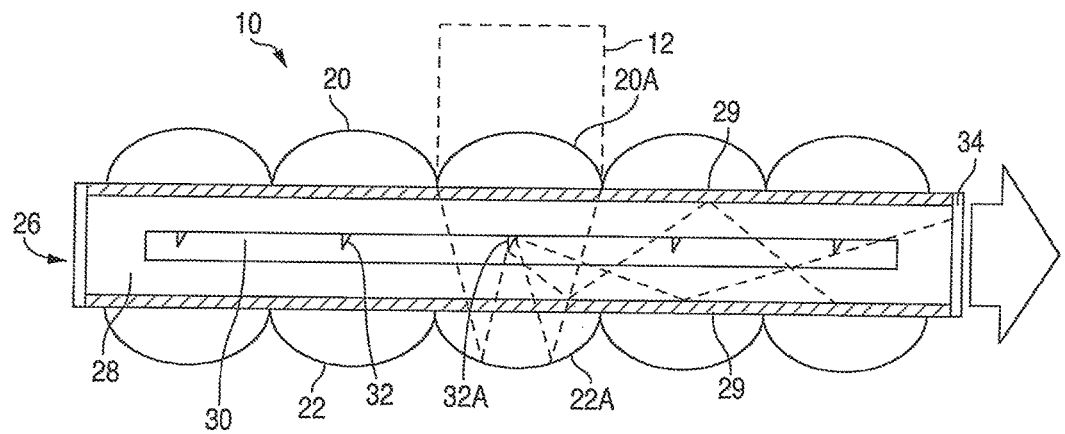
FIG. 4 illustrates sunlight rays impinging on the input lenses at a normal angle, where the transparent sheet is positioned so that the angled mirrors are centered with respect to the focusing lenses and concave focusing mirrors for optimal light output. In the example, the angled mirrors have two tilted surfaces for deflecting the light toward two edges of the lightguide.

FIG. 4 illustrates sunlight 12 at a normal angle relative to the panel 10. The sunlight entering the lens 20A is refracted to the middle of the focusing mirror 22A, which then focuses all the light to the tilted mirror 32A, which is centered with respect to the lens 20A and mirror 22A. The light is highly concentrated, since the entire area of sunlight entering the lens 20A is focused on a mirror surface that may have an area that is 0.5% that of the lens 20A. This light is directed at a 90° angle to the stationary light extraction edge 34, where it is optically coupled to the transmission optics 14 of FIG. 1 or coupled to PV cells along the edge. It is assumed that the fluid 28 has the same refractive index as the sheet 30 so guides the light along with the sheet 30. A cladding layer 29, forming at least part of the upper and lower walls of the cavity, has a lower index so there is TIR at the cladding layer 29 interface. The light extraction edge 34 of the transparent cavity may be formed of a relatively high index material to minimize TIR.

Figure 5:
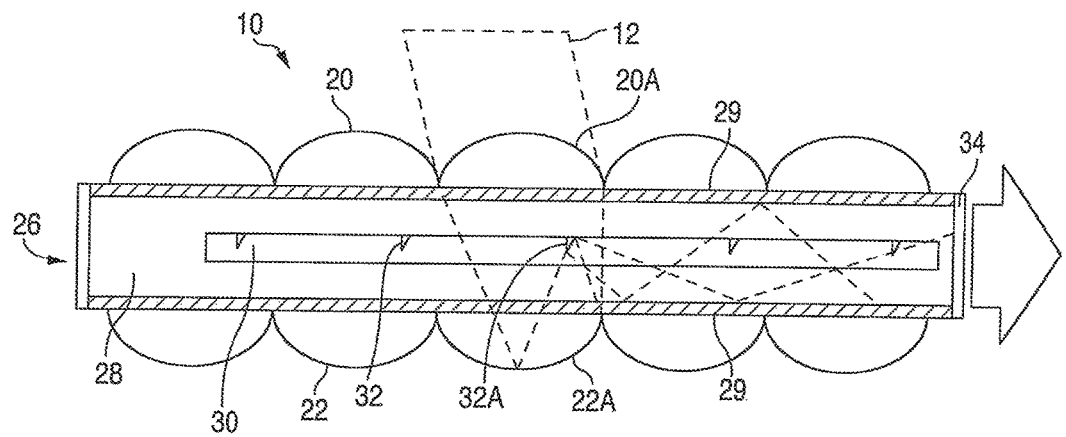
FIG. 5 illustrates sunlight rays impinging on the input lenses at a non-normal angle, where the transparent sheet is shifted so that the angled mirrors receive focused light from the concave focusing mirrors for optimal light output.

FIG. 5 illustrates sunlight 12 at a non-normal angle relative to the panel 10. The sunlight entering the lens 20A is refracted to the right side of the focusing mirror 22A, which then focuses all the light to the right of the center of the lens/mirror pair. A photosensor (described later) on the sheet 30 provides a feedback signal that identifies an optimal xy position of the sheet 30, and an actuator (described later)

shifts the sheet 30 so that the maximum amount of light is reflected off the tilted mirror 32A. In the example, the sheet 30 is shifted to the right.

The refractive lens array may be formed with a plano front surface facing the sun instead of a convex front surface. This provides a system with a flat front surface which can provide reduced fouling and easier system cleaning.

A number of mechanisms may be used to move the sheet 30 over the course of the day so that the tilted mirrors 32, or other reflective features, are always located at the focal point of the sunlight. If an active control system is used, two components are required: a sensing mechanism that determines how the sheet 30 must be moved in order to bring the reflective features to the focal points, and an actuation mechanism that produces the desired movement of the sheet 30. An active control system also permits intentional misalignment of the system if less-than-perfect tracking is desired, for example, to dim or shutter the daylight provided by the system.

Figure 6A:
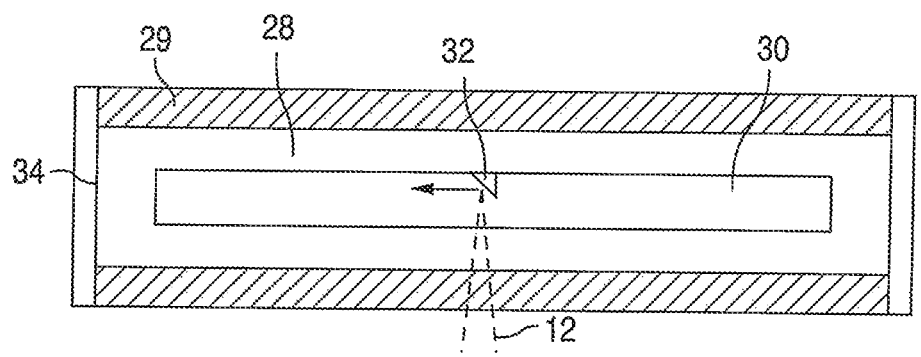
FIGS. 6A, 6B, and 6C are cross-sectional views of various embodiments of the lightguide portion of FIG. 2.
Figure 6B:
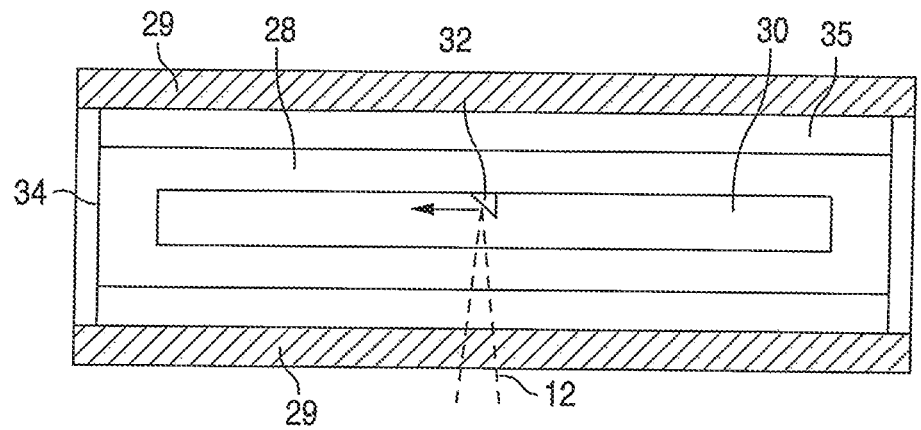
Figure 6C:
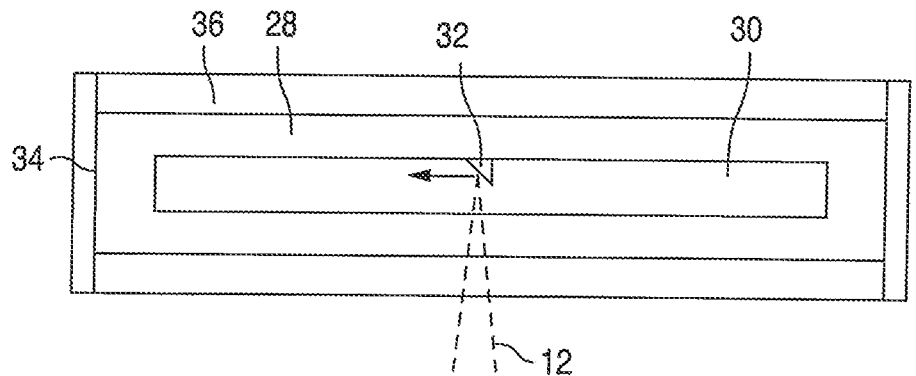

FIGS. 6A-6C illustrate various embodiments of the lightguide and transparent cavity without the lenses and mirrors.

In FIG. 6A, the sunlight 12 ray from the concave focusing mirror is focused on the tilted mirror 32 in the movable sheet 30. The light ray is then deflected to the light extraction edge 34 of the lightguide. The fluid 28 has a refractive index matching that of the sheet, and the cladding layers 29 have a lower index so there is TIR at the interface, and light is contained within the fluid 28 and sheet 30. The sandwiching cladding layers 29 form part of the transparent walls providing fluid containment. The cladding layers 29 can be a thin fluoropolymer film applied to solid sheets of acrylic for mechanic support.

FIG. 6B is similar to FIG. 6A but the transparent fluid cavity is formed of a high index solid material 35. Low index cladding layers 29 on the outside of the material 25 cause there to be TIR at the interface. The cladding layers 29 can be a thin film that does not provide significant mechanical support, and can even be a gas layer.

In FIG. 6C, the fluid 28 has a low refractive index (lower than that of the sheet 30) so there is TIR at the interface, and light is contained only within the sheet 30. Hence, the fluid 28 provides the optical cladding. The cavity walls 36 may be a high index material providing fluid containment. Air may surround the cavity walls 36 to provide a TIR interface in the event light enters the cavity walls 36. One drawback of this technique is that the low index fluid 28 is between the extraction edge of the sheet 30 and the light exit edge 34 of the lightguide, so there may be some spreading of the light between the sheet 30 edge and the light exit edge 34 of the lightguide.

FIG. 7 is a simplified cut-away view of the panel 10 showing the lens array (containing lenses 20), the mirror array (containing focusing mirrors 22), and the movable sheet 30 (containing mirrors 32). The fluid and cladding layers are not shown. At one or more locations substituting for a tilted mirror 32 is a photosensor 44. Many different designs of the photosensor 44 are possible, where the photosensor 44 generally provides a light signal or an electrical signal related to the optimal position of the sheet 30.

For example, if the photo sensor 44 is an active electrical component, such as a photo-transistor, photo-resistor, or photo-diode, there may be four photosensors arranged in quadrants. An actuator shifts the sheet 30 small increments. When the levels of the electrical signals from all four quadrants are the same, the center of the photosensor is centered with the focal point of the sunlight, and the actuator stops shifting the sheet 30. An algorithm may be used, in combination with the feedback signals, that predicts the movement of the sun's rays so that the light is substantially always focused on the tilted mirrors 32. The feedback signals may be converted to a light signal that is detected by another photo sensor external to the lightguide. Any needed electrical power within the cavity may be generated by PV cells on the sheet 30, so the cavity can be sealed.

Many variations on this photosensor design are possible. In one embodiment, the different photosensing segments are placed in different locations on the movable sheet 30 so that they receive light from different catadioptric pairs, instead of all receiving light from a single catadioptric pair.

Furthermore, redundant segmented sensing elements may be placed at various locations across the sheet 30 to provide accurate tracking in case one of the sensors is blocked (for example by partial shading of the panel). Multiple sensing elements also permits separate measurement of the misalignment of the movable sheet 30 due to translational error and rotational error.

It is desirable that the photosensing elements be semi-transparent so that they do not block all incident light as it transits from the refractive lens 20 to the focusing mirror 22. Semi-transparent photosensing elements may be achieved by using semi-transparent photosensitive materials or by patterning opaque photosensitive materials so that they provide partial light transmission, for example by perforating the photosensitive material.

Figure 8:
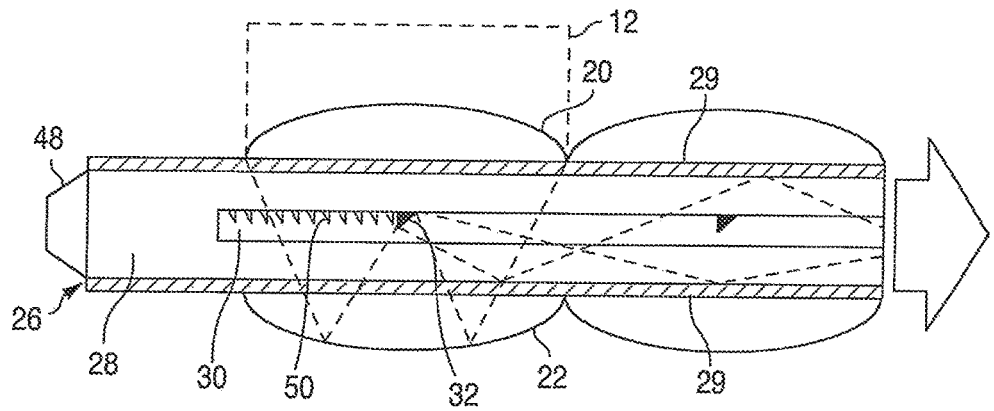
FIGS. 8, 9, and 10 illustrate the use of a 4-segment photosensor system, which comprises electronic sensors and angled mirrors, where the detected reflections from a variety of different mirrors on the sheet identify specific displacement errors relative to an optimal position of the sheet.
Figure 9:
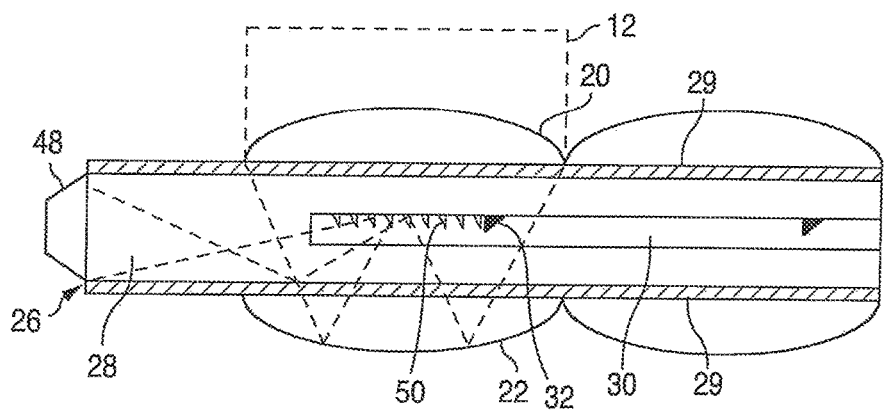
Figure 10:
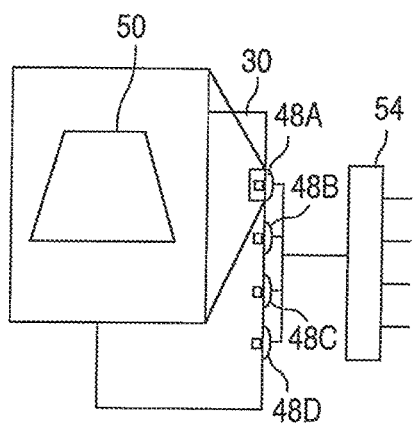

Another possible position-sensing mechanism is shown in FIGS. 8-10. This design uses an area of different types of reflectors (reflector segments 50) on the sheet 30 that occupy a segment of the focal plane for a catadioptric pair and, when illuminated by focused light, deflect that light toward the back facet of the lightguide where photosensors 48 (or 48A-48D in FIG. 10) are positioned. The relative output signal levels of the photosensors 48A-48D can therefore be used to determine if the sheet 30 is at an optimal position. Since there are no electrical components on the sheet 30, the fabrication of the device may be greatly simplified.

In one example, the reflector segments 50 on the sheet 30 are tilted mirrors, each with a different rotational angle so that light from the focusing mirrors 22 reflects off the faces of the different reflector segments 50, and the reflected light is directed towards associated external photosensors 48A-48D. By sensing the relative amounts of light reflected by each reflector segment 50, a microcontroller 54 (FIG. 10) can determine which xy direction to shift the sheet 30. When the light reflected by each reflector segment 50 meets a certain criteria, the sheet 30 is optimally positioned. Many configurations may be employed using this general concept of sensor mirrors on the sheet 30.

Each reflector segment 50 may be positioned in the focal plane of a different catadioptric pair, as shown in FIG. 10, and/or by grouping a number of reflector segments 50 in the focal plane of a single catadioptric pair, with the reflector segments 50 angled so that each segment 50 produces a spatially-distinct light output. In either case, measurement and control circuitry measures the photoresponse of each of the photosensors to determine the location of the focal spots and to actuate the appropriate movement of the movable sheet 30 to bring it into proper alignment with the focal spots formed by the catadioptric pairs. It is desirable that the reflector segments be semi-transparent so they preferably provide reflection only over a portion of the area. This is preferably achieved by forming the reflector segments 50 as a sparse array of tilted reflectors.

In FIG. 8, the sheet 30 is optimally aligned with the sunlight 12, so a maximum level of light is reflected by the tilted mirrors 32 toward the right edge extraction surface for illuminating a room. The reflector segments 50 for the photosensor may be positioned so that, at the optimal sheet 30 position, no light is reflected by the reflector segments 50. For example, the reflector segments 50 may surround a tilted mirror 32. The tilted mirrors 32 may be much larger than the reflector segments since illumination light is wasted when reflected by the reflector segments.

In FIG. 9, the sheet 30 is misaligned so there is little light that is reflected off the tilted mirror 32, but the light is focused on some of the reflector segments 50 and directed toward photosensors 48 along the opposite edge of the lightguide 26 for controlling the actuator to shift the sheet 30.

FIG. 10 is a simplified top down view of the sheet 30 with four different types of reflector segments 50 distributed between selected catadioptric pairs. Each different reflector segment 50 type directs light towards an associated photosensor 48A-48D. A microprocessor 54 detects the relative levels of the reflected light to detect which direction to move the sheet 30 and when the position is optimal.

The actuation mechanism for the sheet 30 may include one or more motors to provide sheet 30 translation. These motors may be placed within the fluid cavity to act directly on the sheet 30, or preferably placed outside of the fluid cavity and coupled with a motion transmission mechanism to move the movable sheet 30 via magnetic coupling or other non-contact system.

Figure 11:
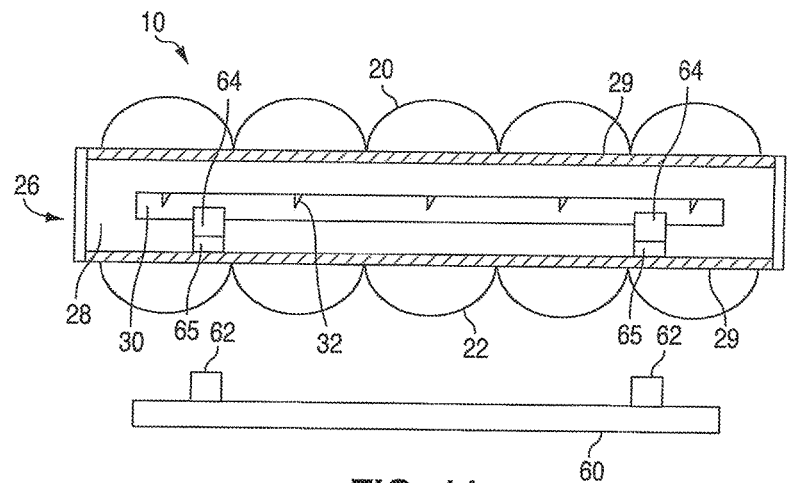
FIG. 11 illustrates the use of a non-contact actuator for translating the sheet using magnets.

FIG. 11 illustrates an xy motorized stage 60 driven by stepper motors, servos or gear motors, etc. that is located external to the panel lightguide 26. Magnets 62 on the motorized stage 60 magnetically couple to magnets 64 or ferrous elements on the sheet 30 causing the sheet 30 to move with motions that correspond exactly to those of the motor-driven magnets 62. A spacer/lubrication layer 65 spaces the sheet 30 from the inner wall of the cavity (which in the example is the cladding layer 29) and provides low friction. Very little force is needed to move the sheet 30 since it is substantially floating in the fluid 28.

Figure 12:
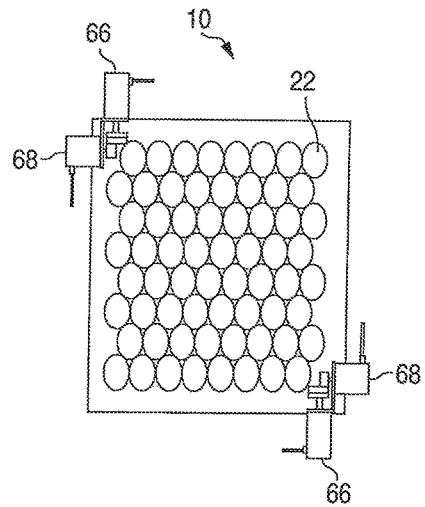
FIG. 12 illustrates the bottom of the solar concentrator panel and non-contact actuators that translate the sheet using magnets.

FIG. 12 illustrates the bottom of the panel 10, where x and y actuators 66 and 68, respectively, are at opposite corners.

Figure 13:
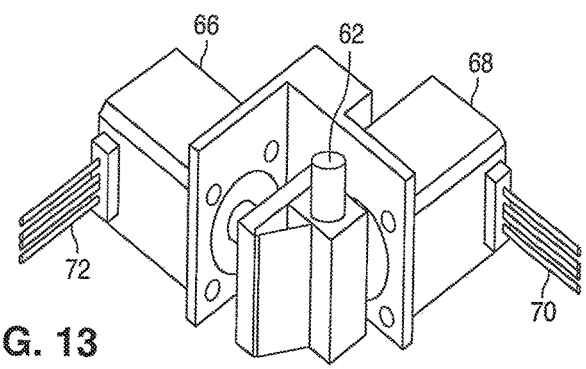
FIG. 13 illustrates further detail of the actuator magnetically coupled to one corner of the sheet.

FIG. 13 illustrates details of the actuators 66 and 68 and the magnet 62 moved by the actuators 66 and 68. The actuators 66 and 68 have small motors and gears that engage screws 70 and 72 to precisely shift the magnet 62 in the desired xy directions. Magnet coupling is preferred to direct coupling since the lightguide 26 cavity may be sealed.

Optionally, smooth motion of the movable sheet 30 can be achieved in this configuration by applying ferrofluid as a lubricating layer that is bound to the magnet attached to the movable sheet 30 and by optimizing the surface across which the magnet on the movable sheet 30 slides, for example, by using a fluoropolymer surface. The ferrofluid is preferably chosen to be immiscible with the liquid contained within the lightguide 26. The surface over which the magnet on the movable sheet 30 slides may optionally be chosen to be a porous solid with a network of pores that are preferentially wet either by the ferrofluid or by the surrounding ambient fluid.

In another embodiment, the transmission mechanism is a string or wire that connects the motor to the movable sheet 30, penetrating the lightguide 26 cavity. Turning the motor winds the string around a spindle, advancing the moving sheet 30 in the direction of the wire. Reversing the motor moves the sheet in the opposite direction. However, a fluid-tight seal is needed for the wires. Alternatively, the heavier lens/mirror arrays can be shifted relative to a stationary lightguide 26.

An additional motor-wire system may also compensate for incidental rotational of the movable sheet 30.

In another embodiment, linear actuators penetrate the lightguide 26 cavity and push directly on the movable sheet 30 to effect its motion. Such actuators may optionally be placed instead within the fluid cavity. Alternatively, actuators may contact the movable sheet 30 using only leadscrews or push rods. In this case, the body of the actuator resides outside of the fluid cavity, and the leadscrew or push rod enters the fluid cavity by way of a straight or threaded hole in the cavity sidewall. This hole is sized and shaped as a sliding seal, such that liquid does not leave the fluid cavity.

Piezoelectric actuators may also be used to provide actuation of the movable sheet 30. Because they can be small, these actuators are well-suited for placement within the fluid cavity of the lightguide 26. Many types of piezoelectric actuators may be used, including stacked piezo actuators, "squiggle" rotating actuators, "inchworm" actuator sets, and "stick/slip" actuators.

Figure 14:
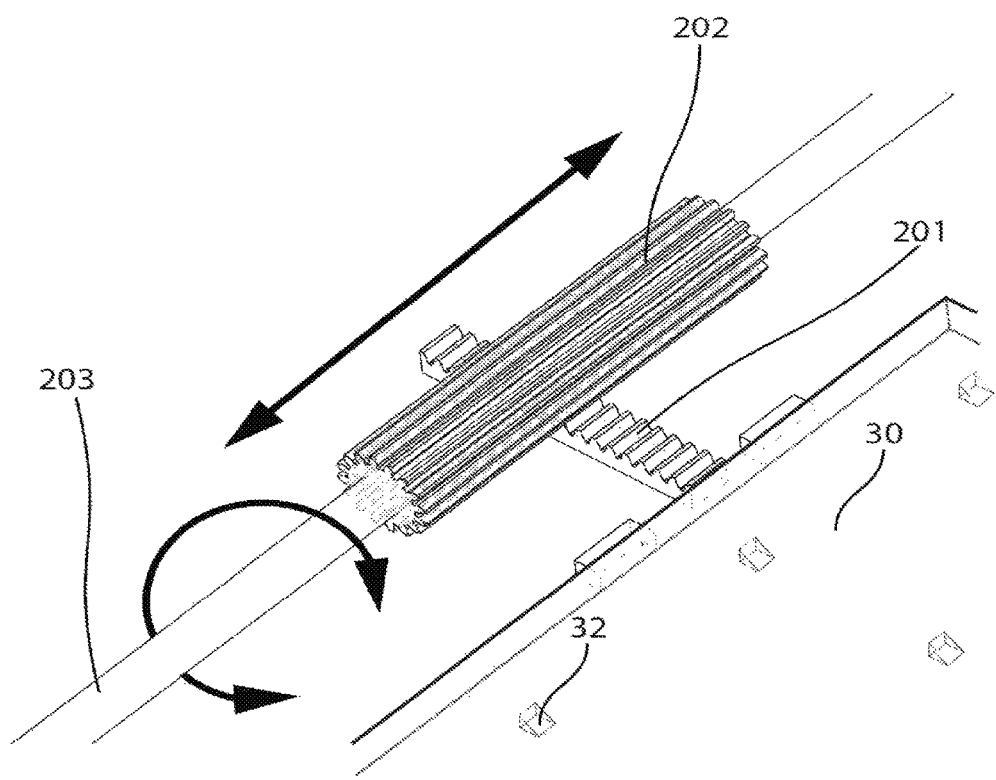
FIG. 14 is an illustration of a rack and pinion design with oversized pinion gear. Rotary motion on the fixed axle drives motion of the central sheet. The rack is free to slide relative to the pinion parallel to the teeth.

In another embodiment, shown in FIG. 14, the actuation system comprises a rack 201 and elongated pinion 202 interface to drive motion in each axis independently and avoids the use of roller bearings, dove-tails, or other complex linear motion devices while providing precise motion in two dimensions and preventing rotation. The unique aspect of this design is that the rack 201 and pinion 202 are free to slide relative to one another in the axis parallel to their teeth, due to the elongated pinion 202 while the meshing of their teeth provides a tight tolerance sliding interface. Either the pinion 202 or the rack 201 or both can be oversized to allow for this translational motion. The length of the pinion 202 is sufficient to cover the entire desired range of movement of the sheet 30 in the direction parallel to the pinion's teeth. Allowing the rack 201 and pinion 202 to drive motion in one axis and slide freely in the other provides two-dimensional motion of the sheet 30 relative to an x-axis axle 203 and y-axis axle 204 (FIG. 16) that are fixed in space, mounted directly to the mirror array 22 (FIG. 11) or front lens array 20.

The pinion 202 is long, which allows the rack 201 to slide along it when motion is in the orthogonal direction. The shaft 203 can be driven by any rotary actuator 210 (FIG. 17A).

Figure 15A:
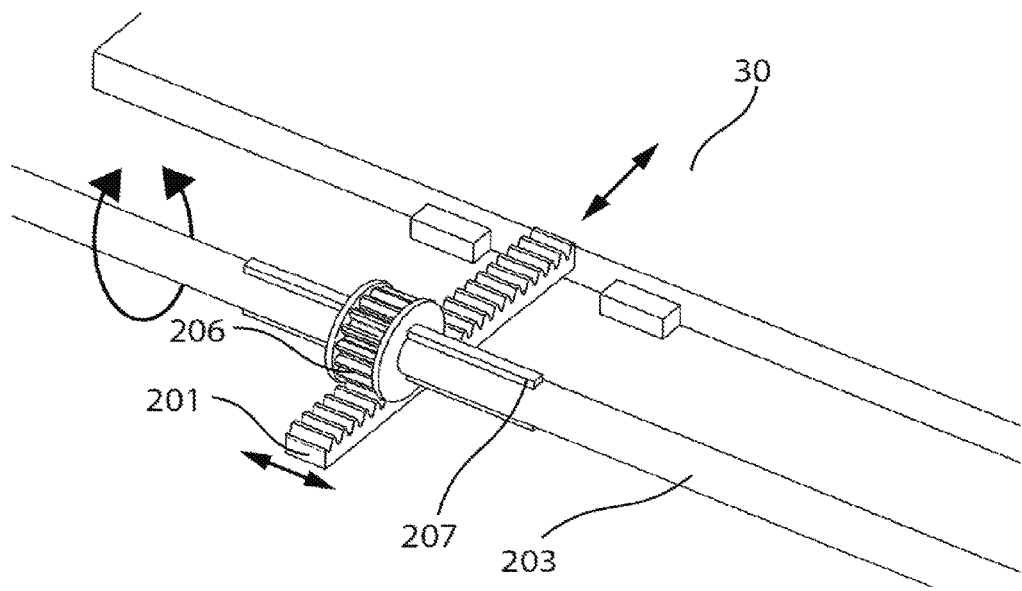
FIGS. 15A and 15B are illustrations of mechanical assemblies with a small pinion gear that slides along a keyed shaft shown in different actuation positions.
Figure 15B:
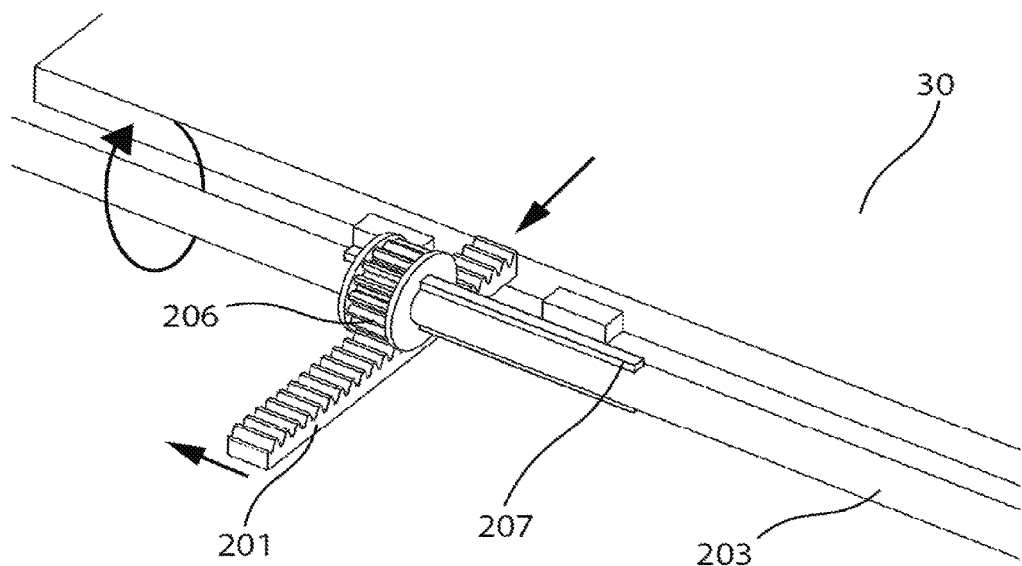

Another embodiment of the design, shown in FIGS. 15A and 15B, would use a keyed shaft 207 or a D-shaped shaft that would allow a narrow pinion 206 to slide along the shaft 203 without being oversized. The small pinion 206 would have a slot that allowed it to slide over a key 207 in the shaft 203. The key 207 would allow the shaft to transmit rotational force but would still permit the pinion 206 to slide along the shaft 203. The pinion 206 or rack 201 would require a retention mechanism such as a lip or ridge to prevent the pinion from falling off the rack.

Figure 16:
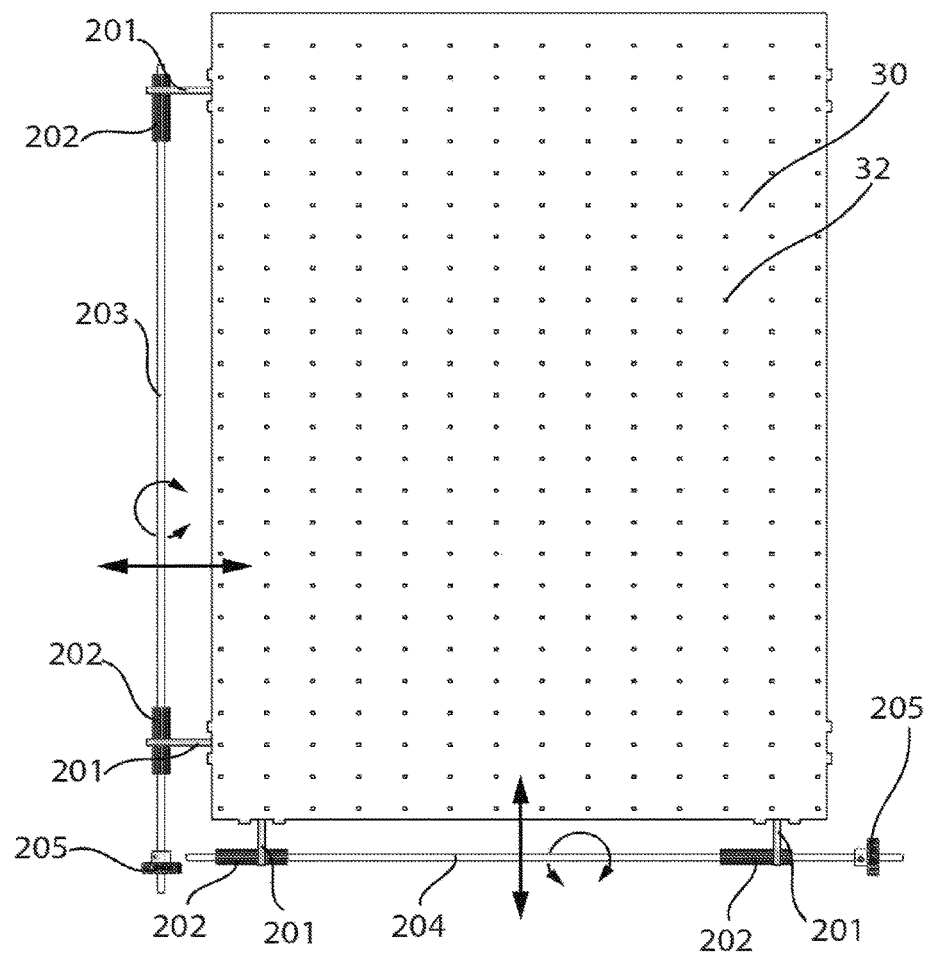
FIG. 16 is an illustration of a two-axis stage designed with sliding rack and pinion system. Each axis can be driven independently. The axle rotates to drive the pinon gear and moves the rack. Rotation of one axle causes the racks on the orthogonal axle to slide along the elongated pinion.

A full system that uses the rack 201 and pinion 202 sliding actuation is shown in FIG. 16. In this embodiment, there are two racks 201 and two pinions 202 on the x-axis axle 203 and two racks 201 and two pinions 202 on the y-axis axle 204. When the x-axis axle 203 is turned by a motor 210, the y-axis axle 204 will have its corresponding rack 201 slide along the pinion 202. When the y-axis axle 204 is turned by a motor the x-axis axle 203 will have its corresponding rack 201 slide along the pinion 202. This complementary motion allows two axes of isolated and orthogonal motion. The design uses two pinions 202 per axis, coupled to racks 201 placed roughly at the corners of the sheet 30. This allows the force exerted on the sheet 30 to be applied evenly and consistently throughout the required travel. The use of two rack 201 and pinion 202 also prevents the rotation of the central sheet 30 relative to the axles 203.

Figure 17A:
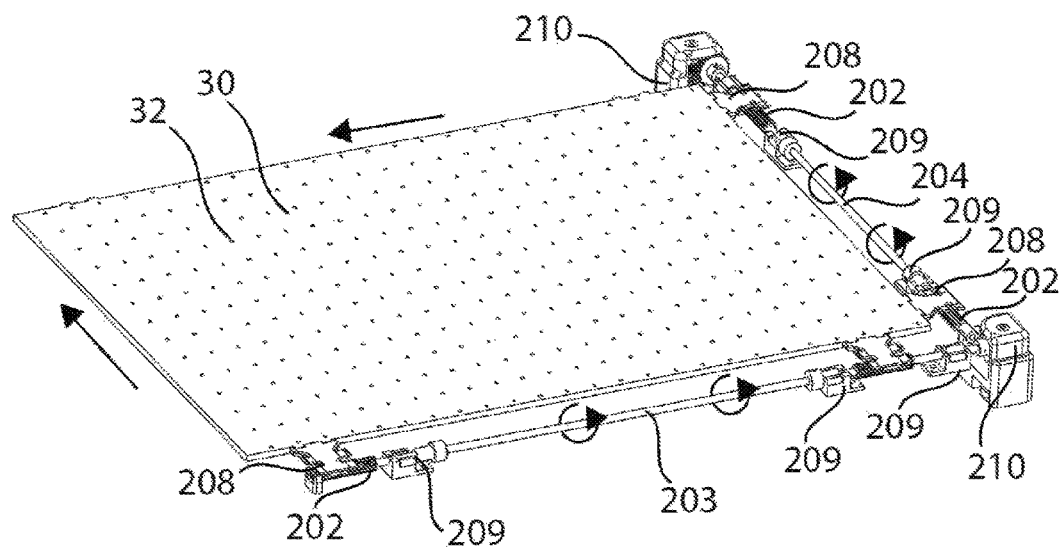
FIGS. 17A and 17B illustrate an embodiment of mechanical system using elongated pinions in two different actuation positions. Two pinions are mounted to each of two orthogonal shafts. The pinions drive racks that are attached to the central sheet. Rotation of the shaft moves the sheet directly with the racks, and causes the orthogonal racks to slide along their pinions.
Figure 17B:
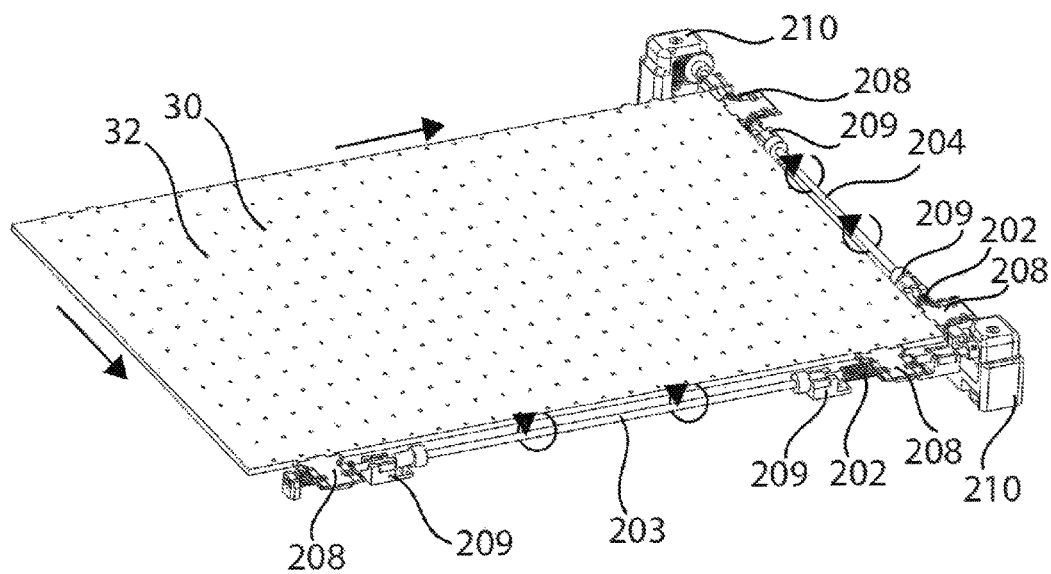

As shown in FIGS. 17A and 17B, the complete system could use molded rack holders 208 to attach a rack 201 to the sheet 30. FIGS. 17A and 17B illustrate an embodiment of the sliding rack 201 and pinion 202 design at two different actuation positions. This embodiment uses a rack holder 208 with tabs for attaching to the sheet 30 and protrusions that push against the top focusing lens 20. These protrusions provide normal force to keep the teeth of the rack 201 well engaged with the pinion 202. The x-axis shaft 203 and y-axis shaft 204 will each require multiple mounting points 209 to hold the shaft in place during rotation by the motors 210. These mounting points 209 could consist of bushings, bearings, or other shaft retention devices like shaft collars. The mounting points 209 ensure that the pinion 202 is in the correct position and provide the normal force required to keep the pinion 202 teeth engaged with the rack 201.

The mechanical system needs to be fixed to either the top focusing lens 20, or another fixed reference relative to the sheet 30.

Figure 18:
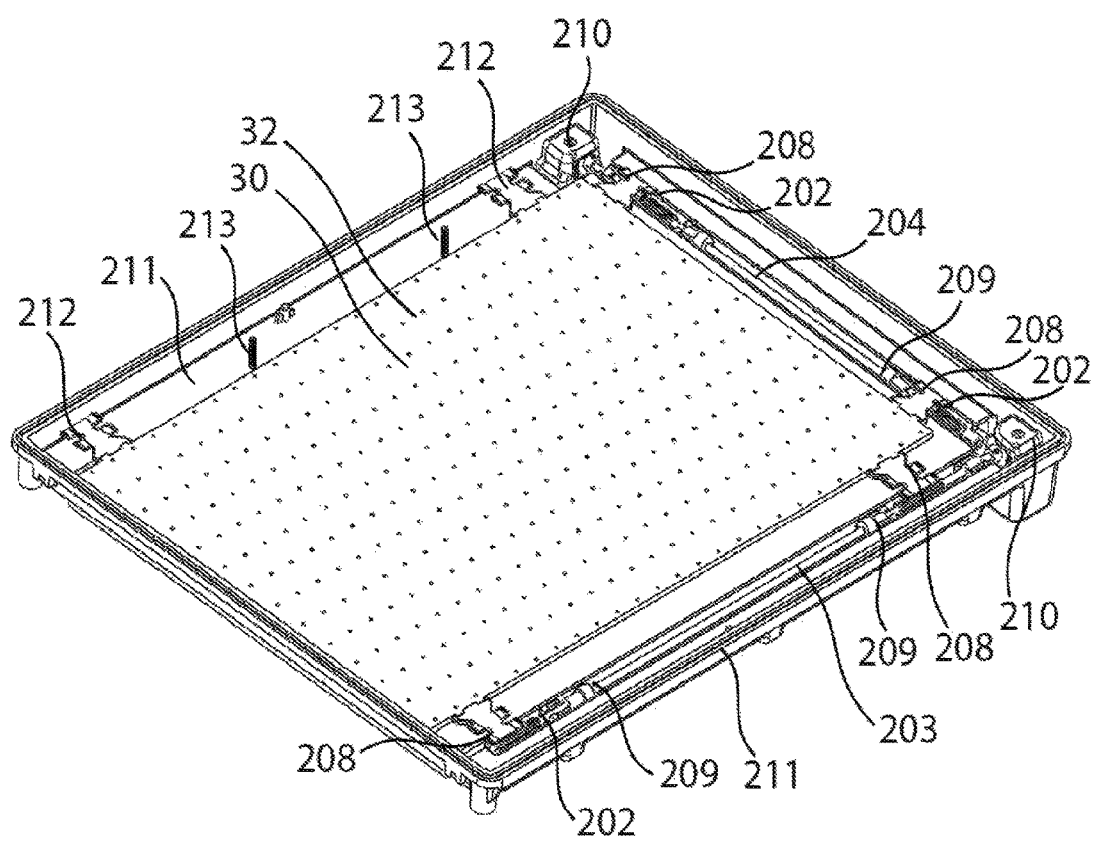
FIG. 18 illustrates a mechanical actuation system mounted into a lens array. The molded lens part holds the motors and shafts in place. The motion of the shafts allows the central sheet to translate relative to the lens array.

FIG. 18 illustrates an embodiment where the mechanical system is mounted to the back of focusing mirror array 22 (FIG. 11), which has an additional molded plastic frame 211 design to house the mechanical system. The motors 210 are fixed in cavities in the molded plastic frame 211. The shaft holders 209 are also fixed to the frame 211. The x-axis shaft 203 and y-axis shaft 204 are driven by separate motors 210, preferably stepper motors with fine resolution to provide precise motion. To balance the forces on the sheet 30, a complementary set of plastic leaf springs 212 is used on the opposite side of the x-axis rack holders 208. These reduce the tendency of the sheet 30 to tip during motion.

This mechanical actuation system is well suited to the task of two-dimensional mechanical motion for catadioptric solar concentrator panels 10. The central sheet 30 can be precisely translated small distances but is prevented from rotating, and the mechanical system needs is compact and uses inexpensive components. The motors 210 driving the shaft 203 rotation can either be inside the concentrator panel 10 or mounted externally and use a magnetic or mechanical torque coupling.

These mechanical designs provide a novel mechanism for precision X-Y positioning of an element while constraining its rotation. Unlike other X-Y positioning stage technologies, this design has the benefit of being very compact and low profile. There are myriad applications in which low-profile X-Y positioning mechanics may be desired, quite apart from the solar concentrator application discussed here. For example, such systems are routinely used in positioning stages for computerized machining and 3D printing platforms.

In another embodiment, a mechanical actuator is not needed, and the sheet 30 is translated by a heat-related system that positions the sheet 30 to its optimal position based on fluid dynamics.

If mounted in a stationary configuration, the collecting panel 10 (e.g., FIG. 19) is preferably located in order to receive the maximum amount of direct sunlight. In general, this is accomplished by placing the panel 10 so that it faces toward the equator and is tilted away from horizontal at an angle equal to the latitude of the location. However, other mounting positions may be used for a variety of reasons, including to adjust for the presence of trees, buildings, or other shadowing objects; to shift the seasonal or daily output profile of the system as desired; and to integrate within building architecture as desired. The panels 10 may be placed on the roof of a building, on a facade, as a portion of an awning, or in other locations or configurations as desired.

As described above, when the solar concentrator panel 10 is used for illuminating a room, transmission optics can be connected to the panel edge in order to route the high-flux light indoors as desired. Various types of transmission optics are possible.

Figure 19:
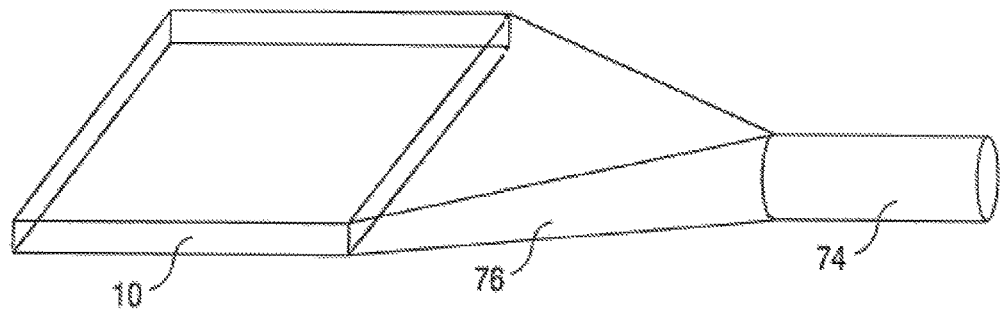
FIG. 19 illustrates the use of the solar concentrator to couple sunlight into a light tube, fiber optics, or other light conduit for supplying light inside a building.

FIG. 19 shows an example of an array of flexible fiber optics 74 optically coupled to the edge of the panel 10 via a tapered section 76 of the fiber optics to accept the concentrated sunlight. These fiber optics 74 may be formed of glass or polymer and of varying diameter as desired. They may be arranged to form a dense array at the emitting face of the concentrator panel 10 and then gathered into a bundle for efficient routing within the building structure. The fiber ends may be embedded in a potting material such as epoxy to form the array. Alternatively, the fiber ends may be fused together to form the array. The fibers may be circular in cross-section or have another cross-sectional geometry such as square, rectangular, or hexagonal in order to provide high packing density in an array.

Alternatively, a hollow light guide may be optically coupled to the edge of the panel 10. The hollow transmission lightguide is lined with reflective material to confine and guide light. The reflective material on the interior may provide specular or scattering reflection of the light or a combination of the two. The reflective lining may be made using a metal film, a multilayer dielectric that provides broadband reflection from interference effects, a prismatic reflector that utilizes TIR, or other techniques. The hollow transmission light guide may be tapered to match the dimensions of the panel lightguide where they meet, or may be connected to the panel lightguide by other optical elements that efficiently convey light from the panel output to the hollow transmission light-guide.

Figure 20:
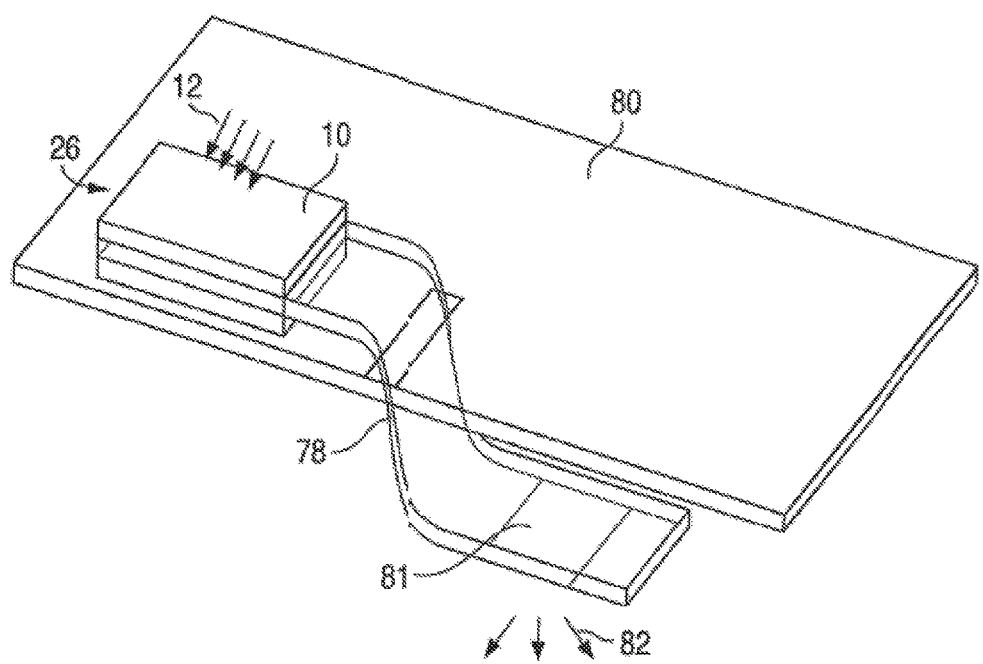
FIG. 20 illustrates the use of a relatively broad light transmission guide providing a wide overhead lighting surface in a building.

FIG. 20 shows the use of a solid slab ribbon lightguide 78 for light transmission within a building 80. The ribbon lightguide 78 is surrounded by low-index cladding material. The ribbon lightguide 78 may be matched to the edge of the concentrator panel lightguide 26, or a number of ribbon lightguides may be attached to the panel lightguide 26 in an array. The ribbon lightguide 78 may be made flexible or rigid, as desired. A portion 81 of the ribbon lightguide 78 may be modified to form an embedded luminaire by texturing the ribbon or producing other optical modifications that cause guided light 82 to locally exit the lightguide 78.

The transmission optics may also be a non-flexible solid lightguide structure that mates onto the edge of the concentrator panel 10 and can be designed to convey the concentrated light as desired. It may be made of a high refractive-index solid with low-index cladding to confine light by TIR. It may also have areas that are coated with reflecting materials to control the flow of light. The solid structure can also be shaped to provide a desired light-emission pattern from the output end so that it provides some of the functions of a luminaire. The solid lightguide transmission structure may be used with a facade-mounted concentrator panel. The solid lightguide transmission structure transmits the concentrated sunlight a short distance, emitting it through a small window in the building exterior wall into a desired range of output angles and bouncing some of the light off the ceiling so that it penetrates deeply into the building interior.

The panel 10 may also direct concentrated sunlight to PV cells or a PV panel to generate power.

Figure 21:
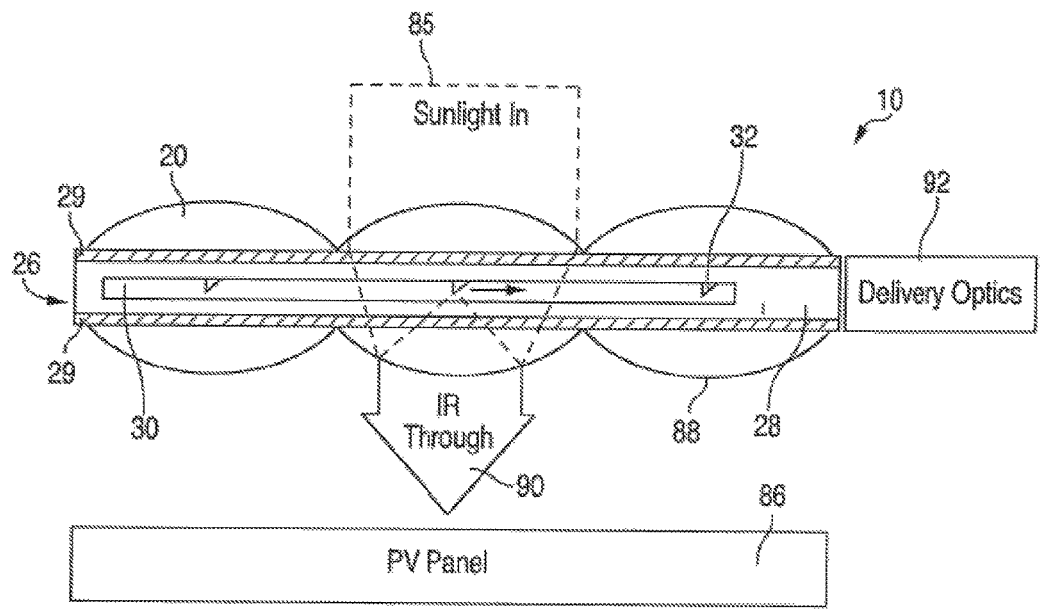
FIG. 21 illustrates the use of the solar concentrator to supply IR light to a PV panel, while visible light is directed to the edge of a lightguide for extraction and delivery to the inside of a building.

FIG. 21 shows a light-capturing panel 84 placed above a conventional PV panel 86 of PV cells. Sunlight 85 is shown entering the lenses 20. The surface of the focusing mirrors 88 in the catadioptric system is coated with a wavelength-selective reflector that reflects the visible light desired for lighting but allows infrared (IR) light 90 to transit through to the PV panel 86. The PV panel converts the infrared light to electricity. The visible light is reflected sideways by the tilted mirrors 32 to the light delivery system 92 for illumination inside a building. The sheet 30 is movable within the fluid 28 as discussed above. In this way, the system is able to make effective use of the majority of the solar spectrum.

Figure 22:
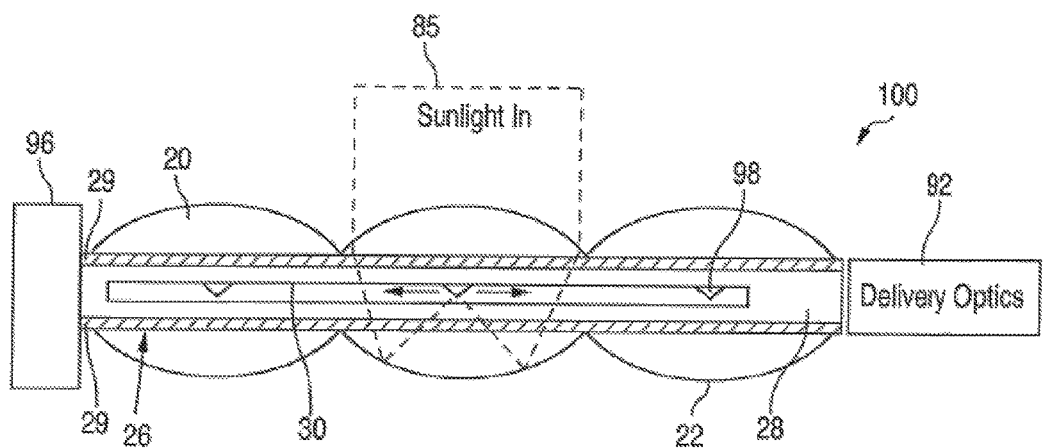
FIG. 22 illustrates the use of the solar concentrator to split the sunlight between PV cells and a light delivery system for illuminating the inside of a building.

FIG. 22 shows a system in which PV cells 96 are mounted on (or near) the edge of the lightguide 26 cavity opposite to where the light transmission delivery system 92 connects. The tilted mirrors 98 (or other reflectors) on the movable sheet 30 have two angles: one that deflects light toward the light transmission delivery system 92 and one that deflects light toward the PV cells 96 along the opposite edge of the lightguide 26. By adjusting the position of the movable sheet 30 in relation to the focal spot, the focused light can be sent to one or the other of these edges, or split between them as desired. In this system, any sunlight that is not used for lighting can be collected for photovoltaic electricity generation. For example, a system may be controlled to send most sunlight toward the PV cells 96 during the middle of the day (when the panel 100 receives a great deal of sunlight) and most sunlight toward the light transmission delivery system 92 at other times of the day (when the panel receives less sunlight), thus providing a nearly constant light output for use in illumination while capturing excess light for conversion into electricity.

A further variation of the design is to replace the PV cells 96 with thermal absorbers that capture the excess sunlight for useful heat generation, such as to heat water.

In another embodiment, the structure may be used to direct light in a path that is the reverse of that described above. Light may enter an edge of the lightguide and be uniformly output across the entire top of the panel by deflection off the tilted mirrors and collimated by the focusing mirrors and refractive lenses. The direction of output from the entire top of the panel can be adjusted by adjusting the position of the movable sheet. The system designs presented herein may be used for purposes other than interior lighting or electricity generation. Concentrated sunlight produced by the panel may be used exclusively for heat generation by replacing the transmission optics with heat capture devices, for example, an evacuated tube receiver that contains a flowing thermal fluid.

The movable lightguide portion within the stationary cavity may also be used in applications other than concentrating sunlight. In such cases, the refractive lenses and concave focusing mirrors may not be needed. For example, the incoming light may be from a laser. The movable sheet allows the laser to be coupled into the lightguide at a broad range of positions, which is not possible in conventional lightguides with fixed coupling features. In another example, light from a laser may be input into the edge of the lightguide, and tilted reflectors on the movable sheet within the fluid redirect the light to optics distributed across the surface of the cavity to provide a uniform or directed light emission or other desired light emission. Movement of the sheet may cause the output beam to be directed at virtually any desired angle. Many other applications are possible.

In some embodiments, the catadioptric pairs have an asymmetric aperture for more efficient collection of light within the waveguide. Solar concentrators described in the prior art all fail to mention or take advantage of the asymmetric path traced by the sun during the course of the year. This asymmetry arises from the combination of the earth's rotation and the earth's axial tilt, which means that though the year the sun is making a different arc each day.

Figure 23:
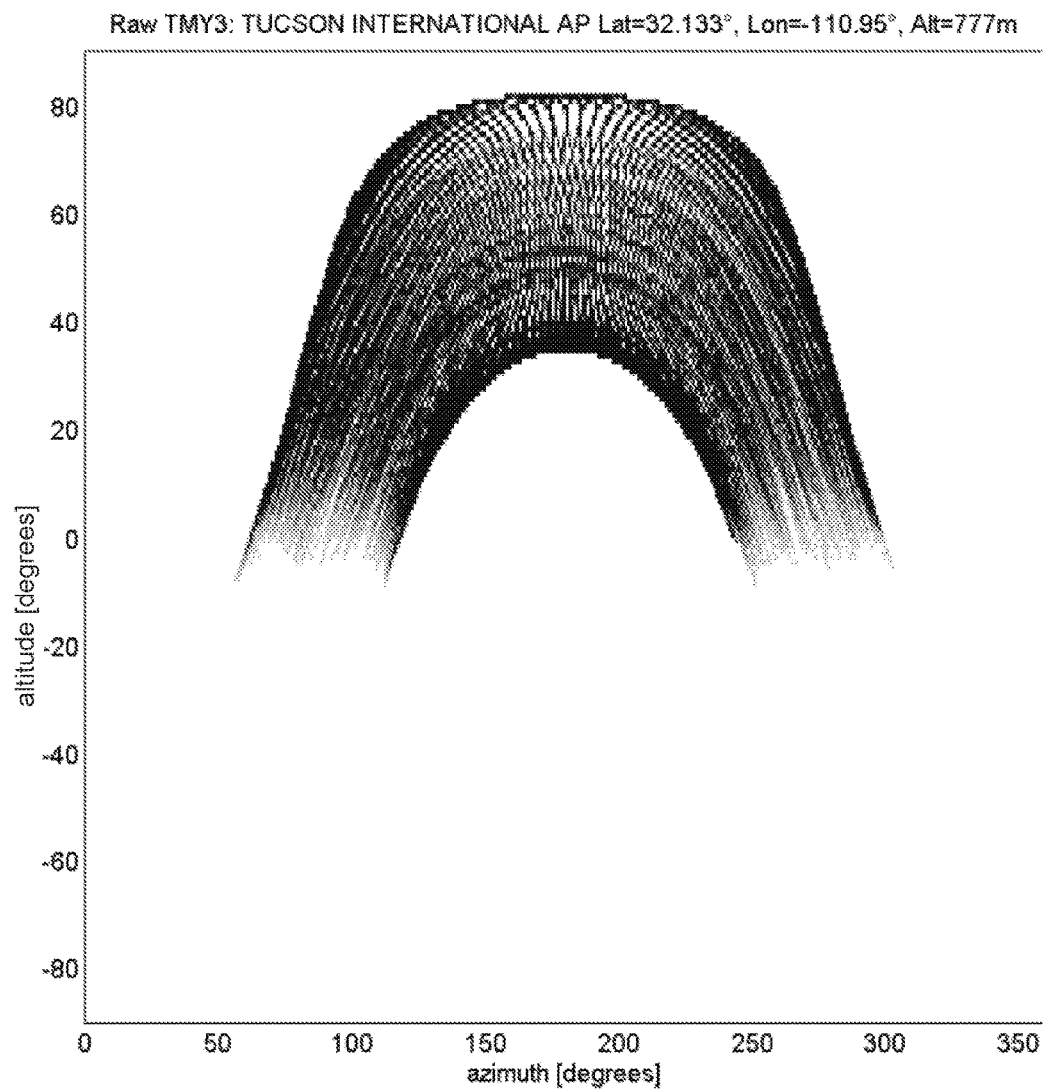
FIG. 23 is a plot of accumulated direct solar radiation on a horizontal panel over one year.
Figure 24:
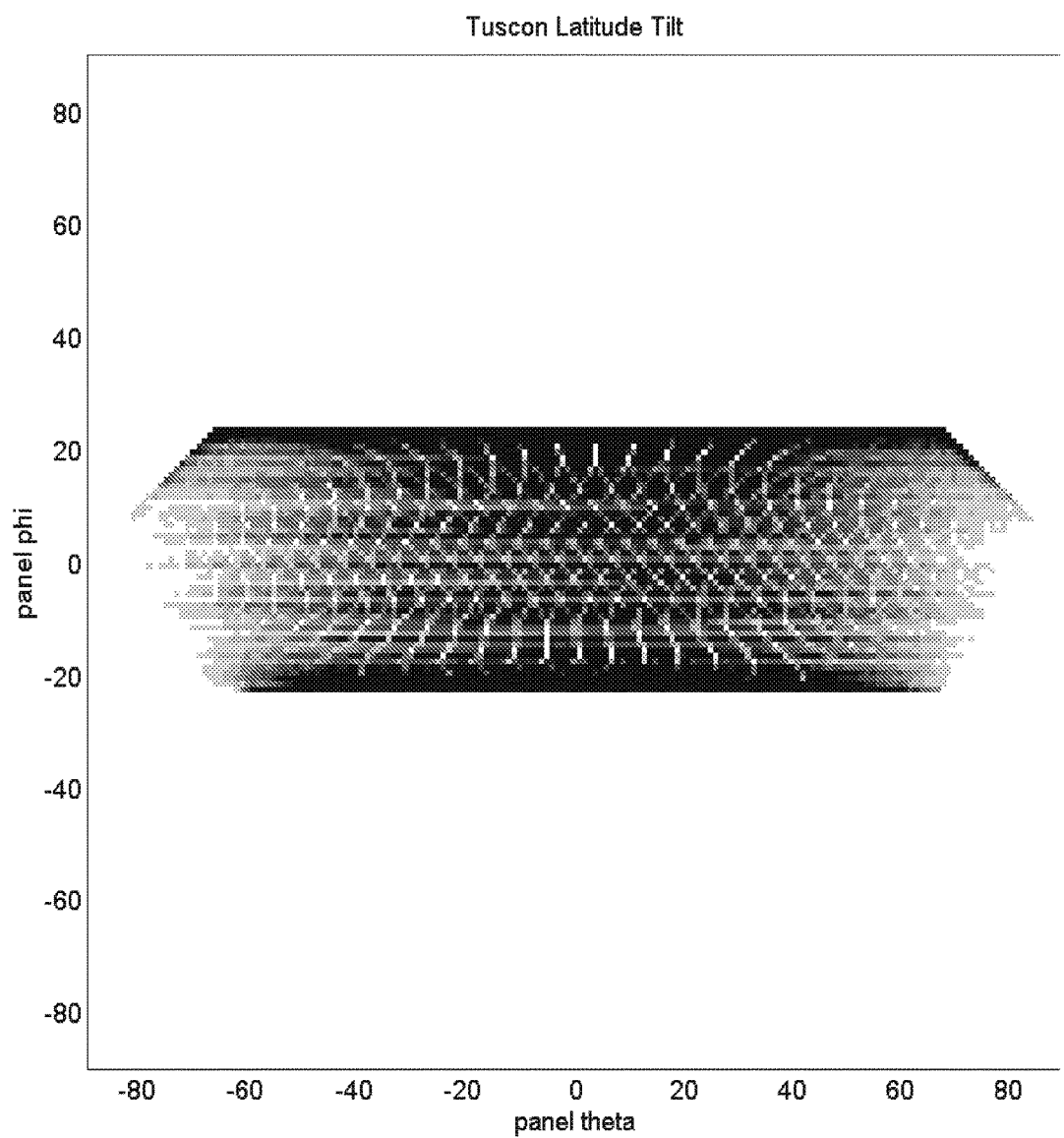
FIG. 24 is a plot of accumulated direct solar radiation on a south facing panel tilted at latitude over one year.
Figure 25:
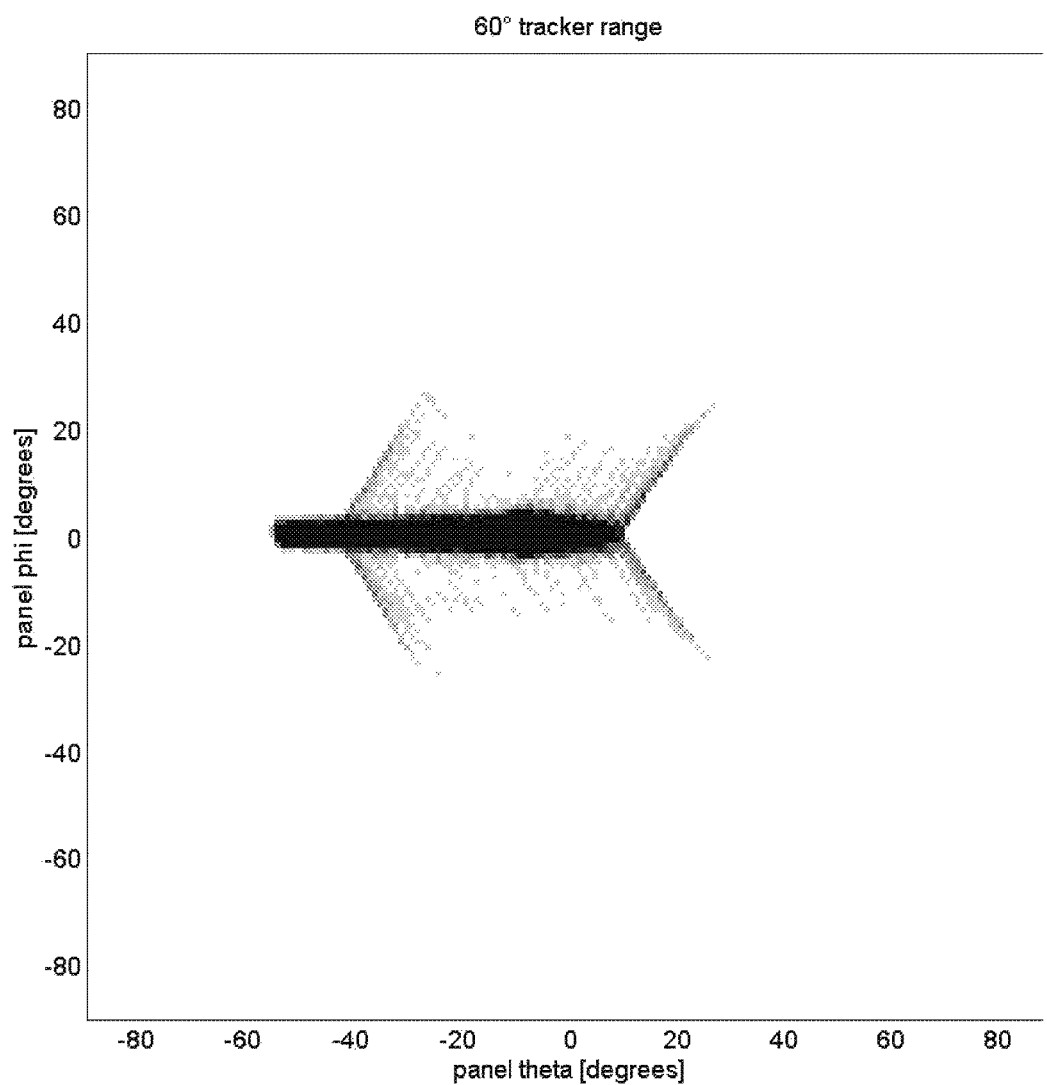
FIG. 25 is a plot of accumulated direct solar radiation for a panel on a horizontal single axis tracker with 60 degree range over one year.

FIGS. 23-25 show the direct solar energy accumulated on terrestrial horizontal surfaces with various inclination and orientation as a function of the altitude and azimuth angle of the sun throughout the year.

FIG. 23 is a plot of accumulated direct solar radiation on a horizontal panel throughout one year, where each dot effectively corresponds to the position of the sun at intervals during the day. For a single day, a single arc of dots would trace the sun's path across the sky. The multitude of different arcs illustrates how the arc of the sun changes over the year, where the arcs are higher and longer in the summer and lower and shorter in the winter.

FIG. 24 is a plot of accumulated direct solar radiation on a south facing panel tilted at latitude. The x-axis (theta) shows the angles of the sun's rays impinging on the panel at intervals over one year in the East to West direction, and the y-axis (phi) shows the angles of the sun's rays impinging on the panel at the intervals over one year in the North to South direction. The width of the plot is due to the range of arcs of the sun over one year.

FIG. 25 is a plot of accumulated direct solar radiation for a panel on a horizontal single axis tracker with 60 degree range over one year. The plot is much thinner than the plot of FIG. 24 since, in FIG. 24, the panel is fixed in position and, in FIG. 25, the panel somewhat tracks the sun so the impinging rays are more normal to the panel's top surface.

As can be seen in FIG. 25, where the accumulated energy is plotted for a panel that is on a horizontal single axis tracker that has a ±60° tracking range, the energy distribution is even more asymmetric and no longer centered around zero in the theta axis.

FIGS. 23 and 24 show that there is a wide angle of sun rays impinging on a fixed solar collection panel over the year between the East to West direction, and a less-wide angle of sun rays impinging on the panel over the year between the North to South direction. Thus, the range of sun-ray impinging angles on a fixed position panel (e.g., mounted on the roof of a building) in the East to West axis of the panel versus the range of sun-ray impinging angles in the North to South axis of the panel is asymmetric. The various sun-ray angles over the year also vary depending on the latitude of the panel. A lens array and associated mirror array in a catadioptric system will now be described where each lens and associated mirror have an asymmetric shape that better corresponds to the varying paths of the sun over the year to more efficiently focus the sun's rays onto the angled reflectors in the movable sheet positioned between the lens array and mirror array, such as the movable sheet 30 in FIGS. 2-11.

Figure 26:
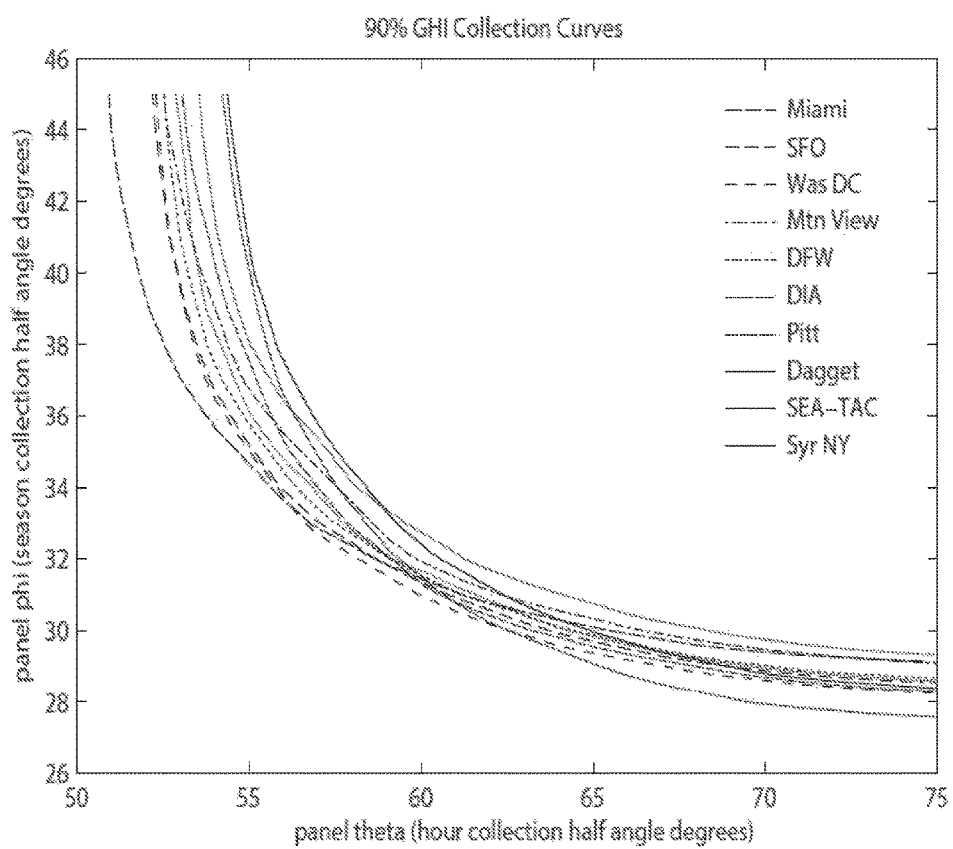
FIG. 26 shows 90% Direct Normal Irradiance (DNI) collection curves for a number of locations in the United States.

In these embodiments with asymmetric lenses, the optimal acceptance range for each aperture (each lens) is determined according to what the angular range of the potential input light will be for a given location. By integrating Typical Meteorological Year (TMY) data for different locations on earth, it is possible to simulate what angles of light will be incident on a panel in a real world environment. To approximate a panel that is installed in a real building environment, where the panel will be positioned in line with the building axis, we assume that the panel rotation may be up to ±45° from due south. The panel used for the experiment accumulated sun-ray angle data over a year. The panel is fixed in position once installed (i.e., no active sun tracking). To accommodate this rotation, it is necessary to tilt the data collector panel away from latitude. For each building rotation, an optimal tilt was selected that provides the highest annual light collection. FIG. 26 is the result of this analysis, showing the theta and phi sun ray impinging angles over the year on a fixed data collection panel optimally mounted in very diverse latitudes (e.g., Miami, Fla. vs. Syracuse, N.Y.). This collected data was used to design the asymmetric lenses and mirrors as described below.

For each of a dozen cites, the TMY data was analyzed and the sun light collection of a panel was determined based on its acceptance angles in the two principal axes. The light that is collected by the panel is then compared to the global horizontal light, which is what would be collected by a horizontal plane of the same aperture. All the locations displayed a similar curve, and using this analysis we selected theta=60° and phi=32° as the acceptance angles, where theta is the angle in the daily axis (aligned substantially East-West), and phi is the angle in the seasonal axis (aligned substantially North-South). This is the optimal angular acceptance range for a solar collection device that is mounted in a variety of orientations. If the concentrator will only be mounted facing the equator and at latitude tilt, the angular range in phi can be reduced to 23.5°. This additional restriction would allow the system to accept even higher angles in theta. For a single axis tracked system, the analysis would be done in much the same way, but the resulting angle ranges are different.

The design of the asymmetric optical element requires defining the aspect ratio between the two optical axes. This aspect ratio is determined by the level of asymmetry in the incoming light. There is no universal optimum, as the orientation that the panel will be installed must be considered. During use as a stationary collector, where only the sheet with the angled reflectors moves, the long axis of the optics is substantially aligned East-West and the short axis of the optics is substantially aligned North-South (or as best approximated within the limits of the installation).

Figure 27:
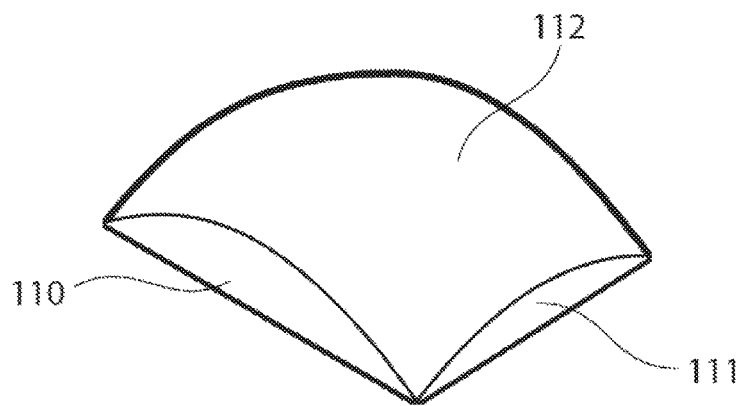
FIG. 27 is a perspective view of a single asymmetric lens for use in a lens array.

FIG. 27 is a rendering of a potential asymmetric lens design, for use in the refractive lens array, with a 3:4 ratio. The asymmetric lens array may replace the "symmetric" lens array shown in FIGS. 2-11. The lens 112 has a non-square, rectangular footprint. The long axis 110 effectively has a lower f/# (f-number or f-stop) and higher angular acceptance along the East-West direction. The short axis 111 effectively has a higher f/# and lower angular acceptance along the North-South direction. The lens curvature is rotationally symmetric, and the optical design innovation is contained in the rectangular aperture of the lens.

In one embodiment, the refractive lenses and focusing mirrors both have rotationally symmetric surface profiles, where centers of rotational symmetry of the refractive lenses and focusing mirrors are located at the centers of the respective apertures. In another embodiment, the centers of rotational symmetry of the refractive lenses and focusing mirrors are offset from the centers of the respective apertures.

By restricting the short axis 111, the lens is able to have greater curvature (longer arc) in the long axis 110, creating a tradeoff between angular acceptance in the two axes. In a conventional system with square, hexagonal, or circular lens apertures, there is no intentional asymmetry in the angular acceptance and the acceptance angles are designed to be as symmetric as possible. In contrast, in the lens design shown in FIG. 27, there is significant difference in the optical performance of the two axes due to the asymmetry of the lens, which makes it better matched to systems that are designed to capture sunlight.

Figure 28:
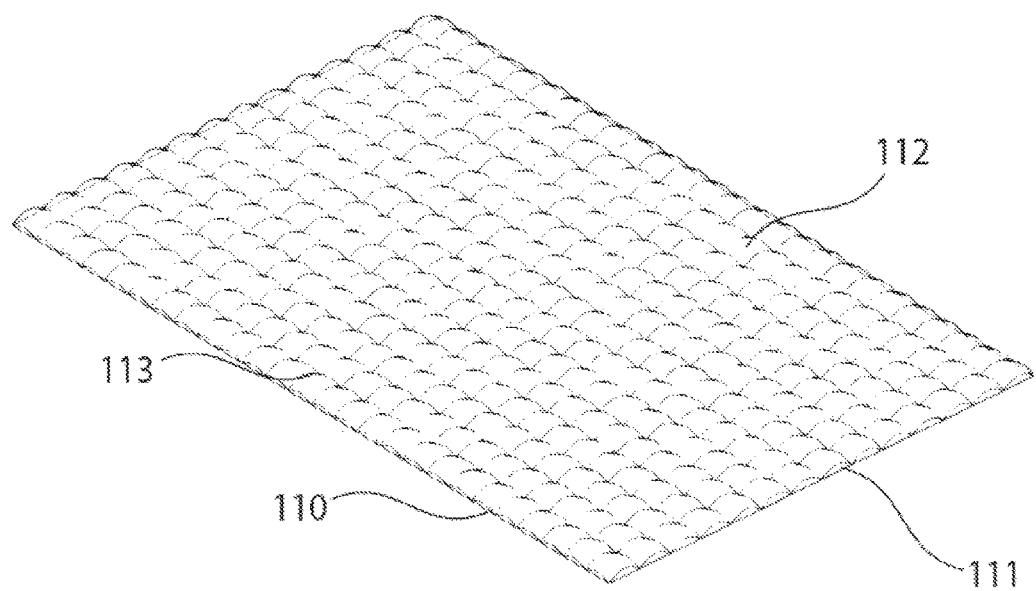
FIG. 28 is a perspective view of the lens of FIG. 27 in an array of lenses.
Figure 29:
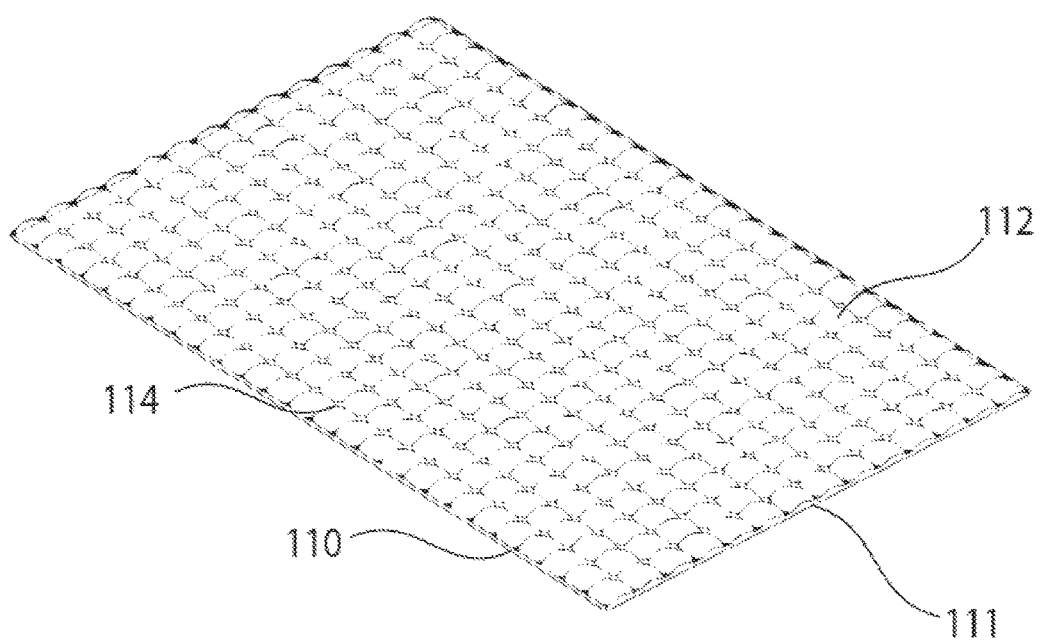
FIG. 29 is a perspective view of the array of lenses of FIG. 28 but with the thin intersections of four lenses filled in with the lens material to add structural stability.

An array of these lenses 112 is shown in FIG. 28, which may substitute for the lens arrays in the solar collectors of FIGS. 2-11. The lenses 112 can be arrayed into arbitrarily large arrays, allowing for large overall collection of light by a solar concentration device. The intersection 113 of four lenses 112 is characterized by the material forming the array coming to a point. At this point, the material of the lens array reaches its thinnest, which may present a potential manufacturing problem. An additional innovation is to fill these corners with transparent lens material as shown in FIG. 29. Filling in the corners 114 where four lenses 112 meet allows for easier manufacturing and improves the strength of the array while only consuming the least optically active portion of the lenses 112. For a given design, it is possible to fill the lens corners without significant impact to the optical performance.

When implemented in a catadioptric system with asymmetric refractive front lenses and asymmetric reflective back mirrors (which correspond to the 3:4 asymmetry of the front lenses), it is possible to create a system with wide angular collection range in one axis, and more restricted collection range in the other axis. This lens/mirror asymmetry better accounts for the sun's changing arc over the year while using a fixed-position panel, having the movable sheet with angled reflectors, or with a panel that only has a limited tracking range. The asymmetry may be further optimized for a given latitude.

The asymmetric lenses in the array provide a more focused cone of sunlight on the associated asymmetric mirrors in the underlying mirror array over the course of a year, as the sun's arc changes (higher arcs in summer and lower arcs in winter). Put another way, the asymmetric lens design results in an asymmetric cone of light impinging on the angled reflector located at the focal point. This asymmetric light cone can be directed into the guided modes of the lightguide with high optical efficiency, while still permitting capture over a wide range of angles in the daily (East-West) axis.

This results in more focused sunlight on the angled reflectors in the flat movable sheet 30 (FIGS. 2-11) and thus a more efficient system. Not only is more sun light collected, but the reflectors on the movable sheet may be made smaller due to the better focusing. The asymmetric lens/mirror array may be used with any type of moveable sheet with angled reflectors for a more efficient solar collector.

The asymmetric optics array may also be used in other types of solar collection systems where the focused sunlight is transmitted to an output of the solar collector.

FIGS. 30A-30D show ray tracings for such a system shown from the short axis 111 and the long axis 110. The element numbers correspond to the elements in FIGS. 2-11, where lenses 20 in a lens array focus sunlight onto mirrors 22, which focus the light onto tilted mirrors 32 in a movable sheet.

FIGS. 30A and 30C show the optics along the long axis with sun rays 12 entering the lenses at two different angles. Note how the light is focused by the mirrors 22 at two different positions due to the different angles of the impinging sunlight. A movable sheet 30 (e.g., FIG. 2) has angled mirrors 32, and the sheet is moved so that the light is focused on the angled mirrors 32 for extraction. FIGS. 30B and 30D show the optics along the short axis 111 for the different angles of impinging sun rays 12.

The two optics work together to collect and concentrate light, but will begin to fail when light from the lens no longer falls on the mirror directly below it. This phenomenon happens more quickly in the short axis 111 than the long axis 110, which results in a narrower collection range.

Note in FIGS. 30A-30B that the mirror size in the bottom mirror array is substantially the same (e.g., 3:4 aspect ratio) as the associated lens size above it, so there is a single mirror associated with a single refractive lens directly above it. Both the lenses and the mirrors have the same rectangular aspect ratio. The corners may be rounded to approximate a rectangle. The curvature of the mirrors depends on the distance from the mirrors to the angled reflectors in the movable sheet, since the angled reflectors are positioned at the focal point of the mirrors.

If the asymmetric angle range is also not centered around zero, as is the case for a horizontal panel, it makes sense to shift the lens aperture off-center as well.

Figure 31A:
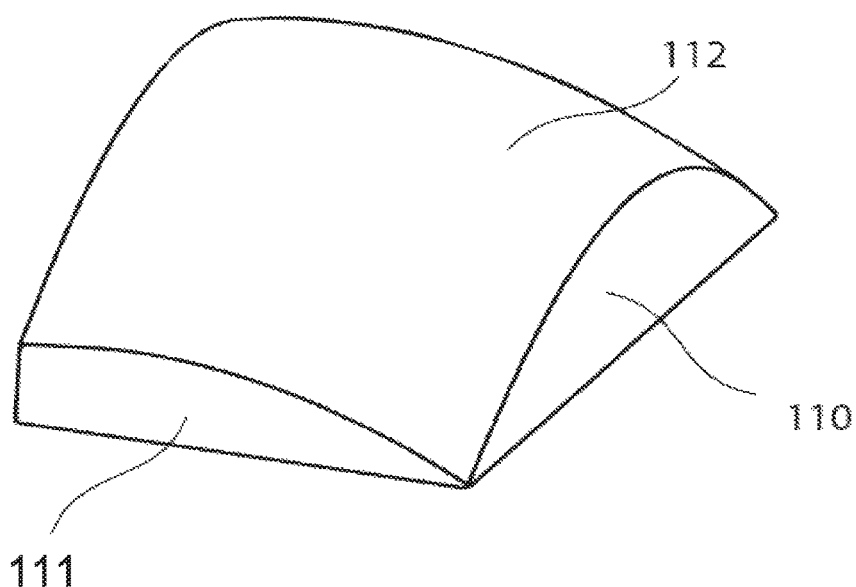
FIGS. 31A and 31B are perspective views of a single asymmetric lens with an off-center aperture.
Figure 31B:
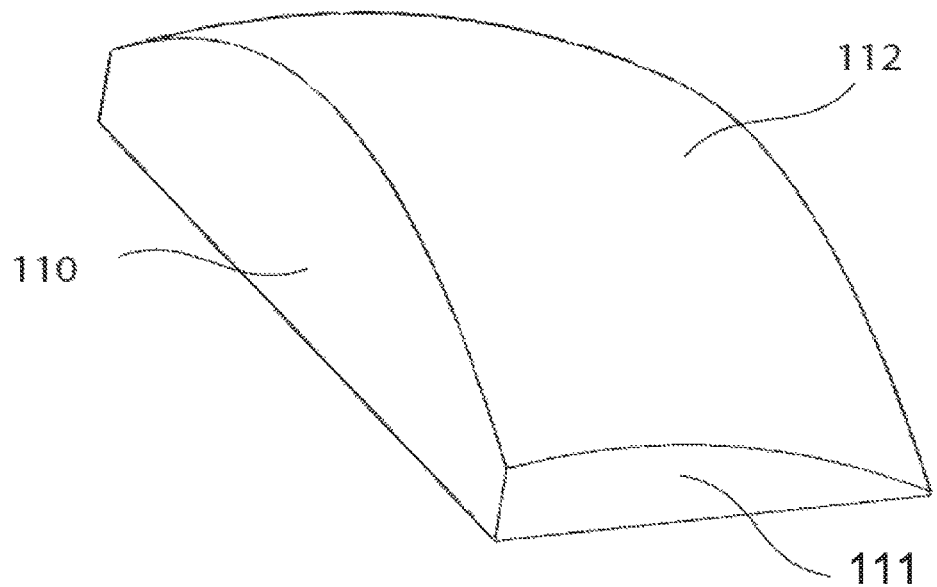

FIGS. 31A and 31B are perspective views of a lens 112 that has a 1:2 aspect ratio, where the center of the aperture is offset in the direction of the short axis 111. Note that the lens 112 is truncated along one long axis 110 side and comes to a point along the other long axis 110 side. Similarly, one short axis 111 side is truncated, and the other short axis 111 side comes to a point. The truncated face of the lens in the short axis 111 is closer to the center of the optic curvature than the long axis 110, creating an off-center aperture. This lens will collect light more effectively in one direction than the other.

Figure 32A:
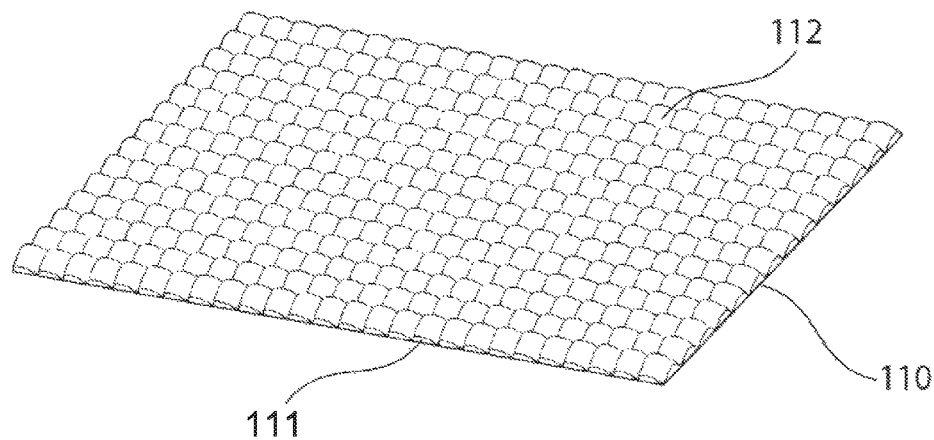
FIGS. 32A and 32B are perspective views of the lens of FIG. 31 in a lens array.
Figure 32B:
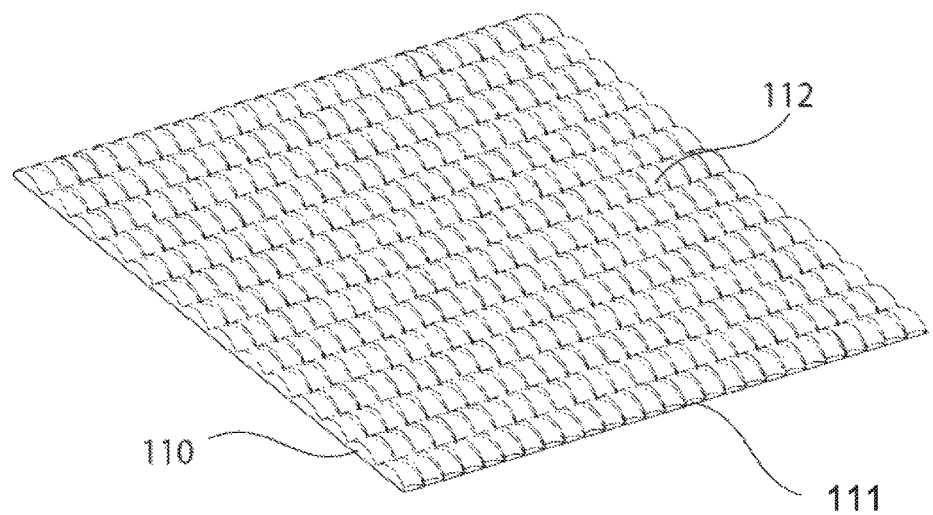

FIGS. 32A and 32B show two perspectives of an array of such lenses that have been tiled together. The truncated face may present a discontinuity in the array, but the optical function is preserved. Such an array is well suited to system where collection of light from an asymmetric and off-center source is required.

It is envisioned that the panel using the asymmetrical lens array can be used in applications other than solar energy collection.

While particular embodiments of the present invention have been shown and described, it will be obvious to those skilled in the art that changes and modifications may be made without departing from this invention in its broader aspects and, therefore, the appended claims are to encompass within their scope all such changes and modifications.

What is claimed is:

1. An optical system for collecting sunlight comprising:
   an array of refractive lenses for receiving external light, each lens having an elongated first aperture with a first aspect ratio so that the first aperture is asymmetric with a first long axis and a first short axis;
   an array of focusing mirrors, wherein each mirror is paired with one of the lenses, and wherein the light entering the lenses is focused by the associated mirrors on a focal plane between the lenses and the mirrors, each mirror having an elongated second aperture with first aspect ratio so that the second aperture is asymmetric with a second long axis and a second short axis; and
   a movable array of reflector elements between the array of refractive lenses and the array of focusing mirrors substantially at the focal plane, wherein light from the focusing mirrors reflecting off the reflective elements is redirected to a light output area of the optical system, wherein the asymmetry of the first aperture and the second aperture is such that the system is configured to collect light rays impinging on the array of refractive lenses over a first range of angles along the first long axis and over a second range of angles along the first short axis, wherein the first range of angles is greater than the second range of angles.

2. The system of claim 1 further comprising:
   a lightguide between the lenses and mirrors, the lightguide comprising a movable transparent solid sheet containing the reflective elements having a tilted reflective surface, wherein light from the focusing mirrors reflecting off the reflective elements is redirected to at least a first light extraction edge of the lightguide; and
   a transparent fluid substantially surrounding the sheet within a cavity,
   wherein the sheet is movable within the fluid, and with respect to the fluid, to position the reflective elements in a desired alignment with focal spots of light within the focal plane to control an amount of light emitted through the first light extraction edge of the lightguide.

3. The system of claim 1 wherein the refractive lenses and focusing mirrors both have rotationally symmetric surface profiles.

4. The system of claim 3 wherein centers of rotational symmetry of the refractive lenses and focusing mirrors are located at the centers of the first aperture and the second aperture.

5. The system of claim 3 wherein centers of rotational symmetry of the refractive lenses and focusing mirrors are offset from the centers of the first aperture and the second aperture.

6. The system of claim 1 wherein the first aspect ratio and the second aspect ratio are approximately 3:4.

7. The system of claim 1 wherein the first aspect ratio and the second aspect ratio are approximately 1:2.

8. The system of claim 1 wherein the optical system comprises a solar collection panel, wherein the panel is positioned so that the first long axis is along a substantially East-West direction.

9. The system of claim 1 further comprising transmission optics coupled to the output area of the optical system for redirecting light from the reflective elements.

10. The system of claim 1 further comprising:
    a sensor configured to provide a signal indicating a position of the movable array of reflector elements relative to focal spots of light within the focal plane; and
    an actuator coupled to the movable array of reflector elements for translating the movable array of reflector elements, based on the signal provided by the sensor, to position the reflective elements in the desired alignment with focal spots of light within the focal plane.

11. The system of claim 1 where the lenses have substantially rectangular shapes.

12. The system of claim 1 wherein the lenses are not rectangular.

13. The system of claim 1 wherein a curvature of each of the refractive lenses has a first rotationally symmetric surface profile, and a curvature of each of the focusing mirrors has a second rotationally symmetric surface profile.

14. The system of claim 13 wherein a center of the first rotational symmetric surface profile of the refractive lenses is located at a center of the first aperture, and wherein a center of the second rotational symmetric surface profile of the focusing mirrors is located at a center of the second aperture.

15. The system of claim 13 wherein a center of the first rotational symmetric surface profile of the refractive lenses is offset from a center of the first aperture, and wherein a center of the second rotational symmetric surface profile of the focusing mirrors is offset from a center of the second aperture.

16. The system of claim 1 wherein at least two sides of each lens are truncated.

\* \* \* \* \*